US012640703B2

(12) United States Patent
Goto et al.

(10) Patent No.: US 12,640,703 B2
(45) Date of Patent: May 26, 2026

(54) ACOUSTIC WAVE DEVICE WITH DIELECTRIC LAYER FOR REDUCED TRANSVERSE LEAKAGE

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 949 days.

(21) Appl. No.: 17/816,157

(22) Filed: Jul. 29, 2022

(65) Prior Publication Data
US 2023/0031753 A1 Feb. 2, 2023

Related U.S. Application Data

(60) Provisional application No. 63/227,900, filed on Jul. 30, 2021, provisional application No. 63/227,913, filed on Jul. 30, 2021.

(51) Int. Cl.

| | |
|---|---|
| *H03H 9/02* | (2006.01) |
| *H03H 9/145* | (2006.01) |
| *H03H 9/25* | (2006.01) |
| *H03H 9/64* | (2006.01) |
| *H04B 1/00* | (2006.01) |

(52) U.S. Cl.
CPC .... *H03H 9/02818* (2013.01); *H03H 9/02559* (2013.01); *H03H 9/02574* (2013.01); *H03H 9/02834* (2013.01); *H03H 9/02992* (2013.01); *H03H 9/145* (2013.01); *H03H 9/1457* (2013.01); *H03H 9/25* (2013.01); *H03H 9/6483* (2013.01); *H04B 1/0067* (2013.01)

(58) Field of Classification Search
CPC ........... H03H 9/02818; H03H 9/02559; H03H 9/02574; H03H 9/02834; H03H 9/02992; H03H 9/145; H03H 9/1457
USPC ...... 310/313 R, 313 A, 313 B, 313 C, 313 D
See application file for complete search history.

(56) References Cited

U.S. PATENT DOCUMENTS

| | | | |
|---|---|---|---|
| 7,939,988 B2 | 5/2011 | Goto et al. |
| 7,939,989 B2 | 5/2011 | Solal et al. |
| 7,982,365 B2 | 7/2011 | Goto et al. |
| 8,084,915 B2 | 12/2011 | Hamaoka et al. |
| 8,084,916 B2 | 12/2011 | Goto et al. |
| 8,384,495 B2 | 2/2013 | Fujiwara et al. |
| 8,421,307 B2 | 4/2013 | Okamoto et al. |

(Continued)

OTHER PUBLICATIONS

US 11,929,728 B2, 03/2024, Maki et al. (withdrawn)

(Continued)

*Primary Examiner* — Derek J Rosenau
(74) *Attorney, Agent, or Firm* — VIA LLP

(57) ABSTRACT
An acoustic wave device is disclosed. The acoustic wave device can include a piezoelectric layer, an interdigital transducer electrode over the piezoelectric layer, a temperature compensation layer over the interdigital transducer electrode, and a dielectric layer positioned partially between the piezoelectric layer and the interdigital transducer electrode. The dielectric layer is positioned in an area under a first portion of the interdigital transducer electrode. An area under a second portion different from the first portion is free from the dielectric layer.

20 Claims, 28 Drawing Sheets

(56) References Cited

U.S. PATENT DOCUMENTS

| | | | |
|---|---|---|---|
| 8,427,259 B2 | 4/2013 | Fujiwara et al. | |
| 8,476,991 B2 | 7/2013 | Goto et al. | |
| 8,482,184 B2 | 7/2013 | Goto et al. | |
| 8,482,363 B2 | 7/2013 | Fujiwara et al. | |
| 8,598,968 B2 | 12/2013 | Seo et al. | |
| 8,698,578 B2 | 4/2014 | Nakanishi et al. | |
| 8,704,612 B2 | 4/2014 | Tsurunari et al. | |
| 9,041,486 B2 | 5/2015 | Tsurunari et al. | |
| 9,203,378 B2 | 12/2015 | Fujiwara et al. | |
| 9,722,576 B2 | 8/2017 | Fujiwara et al. | |
| 10,135,422 B2 | 11/2018 | Goto et al. | |
| 10,404,234 B2 | 9/2019 | Bi et al. | |
| 10,483,942 B2 | 11/2019 | Goto et al. | |
| 10,530,331 B2 | 1/2020 | Yamaji et al. | |
| 10,536,131 B2 | 1/2020 | Goto et al. | |
| 10,574,208 B2 | 2/2020 | Goto et al. | |
| 10,749,497 B2 | 8/2020 | Tang et al. | |
| 10,778,181 B2 | 9/2020 | Goto et al. | |
| 10,840,876 B2 | 11/2020 | McHugh et al. | |
| 10,931,260 B2 | 2/2021 | Yamaji et al. | |
| 11,025,220 B2 | 6/2021 | Fukuhara et al. | |
| 11,050,406 B2 | 6/2021 | Maki et al. | |
| 11,082,029 B2 | 8/2021 | Kodama et al. | |
| 11,133,789 B2 | 9/2021 | Maki et al. | |
| 11,205,696 B2 | 12/2021 | Kasha et al. | |
| 11,245,378 B2 | 2/2022 | Tang et al. | |
| 11,368,137 B2 | 6/2022 | Goto et al. | |
| 11,431,319 B2 | 8/2022 | Goto | |
| 11,463,065 B2 | 10/2022 | Goto | |
| 11,489,513 B2 | 11/2022 | Goto | |
| 11,502,668 B2 | 11/2022 | Goto | |
| 11,545,960 B2 | 1/2023 | Goto | |
| 11,552,614 B2 | 1/2023 | Caron et al. | |
| 11,588,465 B2 | 2/2023 | Fukuhara et al. | |
| 11,606,078 B2 | 3/2023 | Tang et al. | |
| 11,616,487 B2 | 3/2023 | Nakamura et al. | |
| 11,616,491 B2 | 3/2023 | Tang et al. | |
| 11,621,690 B2 | 4/2023 | Fukuhara et al. | |
| 11,658,688 B2 | 5/2023 | Abbott et al. | |
| 11,664,780 B2 | 5/2023 | Goto et al. | |
| 11,671,072 B2 | 6/2023 | Goto et al. | |
| 11,677,377 B2 | 6/2023 | Goto et al. | |
| 11,689,178 B2 | 6/2023 | Nakamura et al. | |
| 11,705,883 B2 | 7/2023 | Hiramatsu et al. | |
| 11,722,122 B2 | 8/2023 | Goto et al. | |
| 11,749,712 B2 | 9/2023 | Kasha et al. | |
| 11,750,172 B2 | 9/2023 | Goto et al. | |
| 11,799,445 B2 | 10/2023 | Kodama et al. | |
| 11,804,822 B2 | 10/2023 | Fukuhara et al. | |
| 11,811,392 B2 | 11/2023 | Hiramatsu et al. | |
| 11,824,515 B2 | 11/2023 | Tang et al. | |
| 11,843,366 B2 | 12/2023 | Fukuhara et al. | |
| 11,848,658 B2 | 12/2023 | Hiramatsu et al. | |
| 11,870,421 B2 | 1/2024 | Hiramatsu et al. | |
| 11,876,501 B2 | 1/2024 | Fukuhara et al. | |
| 11,881,837 B2 | 1/2024 | Caron et al. | |
| 11,894,828 B2 | 2/2024 | Nakamura et al. | |
| 11,909,377 B2 | 2/2024 | Caron et al. | |
| 11,909,378 B2 | 2/2024 | Caron et al. | |
| 11,923,822 B2 | 3/2024 | Maki et al. | |
| 11,923,823 B2 | 3/2024 | Fukuhara et al. | |
| 11,936,367 B2 | 3/2024 | Fukuhara et al. | |
| 11,949,404 B2 | 4/2024 | Goto | |
| 11,996,821 B2 | 5/2024 | Goto et al. | |
| 12,009,795 B2 | 6/2024 | Abbott et al. | |
| 12,009,797 B2 | 6/2024 | Goto | |
| 12,047,053 B2 | 7/2024 | Maki et al. | |
| 12,063,027 B2 | 8/2024 | Goto et al. | |
| 2011/0215884 A1* | 9/2011 | Fujiwara | H03H 9/6483 |
| | | | 333/195 |
| 2012/0161577 A1 | 6/2012 | Abbott et al. | |
| 2012/0200371 A1 | 8/2012 | Yamashita | |
| 2013/0026881 A1 | 1/2013 | Okamoto et al. | |
| 2014/0035436 A1 | 2/2014 | Ruile et al. | |
| 2014/0232239 A1* | 8/2014 | Iwasaki | H03H 9/02984 |
| | | | 310/313 C |
| 2016/0226464 A1 | 8/2016 | Fujiwara et al. | |
| 2018/0041187 A1 | 2/2018 | Yashiro et al. | |
| 2018/0152169 A1 | 5/2018 | Goto et al. | |
| 2018/0159494 A1 | 6/2018 | Goto et al. | |
| 2019/0068159 A1 | 2/2019 | McHugh et al. | |
| 2019/0074819 A1 | 3/2019 | Goto et al. | |
| 2019/0123713 A1* | 4/2019 | Daimon | H03H 9/1457 |
| 2019/0379347 A1 | 12/2019 | Goto et al. | |
| 2020/0252045 A1* | 8/2020 | Solal | H03H 9/14538 |
| 2020/0389151 A1 | 12/2020 | Goto | |
| 2021/0099152 A1 | 4/2021 | Goto et al. | |
| 2021/0111688 A1 | 4/2021 | Abbott et al. | |
| 2021/0111694 A1 | 4/2021 | Goto et al. | |
| 2021/0119650 A1 | 4/2021 | Abbott et al. | |
| 2021/0126616 A1* | 4/2021 | Hiramatsu | H03H 9/14541 |
| 2021/0159876 A1 | 5/2021 | Maki et al. | |
| 2021/0159883 A1 | 5/2021 | Kadota et al. | |
| 2022/0158610 A1 | 5/2022 | Goto et al. | |
| 2022/0158612 A1 | 5/2022 | Goto et al. | |
| 2022/0209738 A1 | 6/2022 | Torazawa et al. | |
| 2022/0255534 A1 | 8/2022 | Barsukou et al. | |
| 2022/0263495 A1 | 8/2022 | Wang et al. | |
| 2022/0271730 A1 | 8/2022 | Abbott et al. | |
| 2022/0271733 A1 | 8/2022 | Abbott et al. | |
| 2022/0271734 A1 | 8/2022 | Abbott et al. | |
| 2022/0286105 A1 | 9/2022 | Goto et al. | |
| 2022/0311410 A1 | 9/2022 | Komatsu et al. | |
| 2022/0311419 A1 | 9/2022 | Komatsu et al. | |
| 2022/0311470 A1 | 9/2022 | Goto et al. | |
| 2022/0321088 A1 | 10/2022 | Goto et al. | |
| 2022/0321096 A1 | 10/2022 | Goto et al. | |
| 2022/0329227 A1 | 10/2022 | Goto et al. | |
| 2022/0329229 A1 | 10/2022 | Laaser | |
| 2022/0337219 A1 | 10/2022 | Kovacic et al. | |
| 2022/0399867 A1 | 12/2022 | Goto et al. | |
| 2022/0399871 A1 | 12/2022 | Goto et al. | |
| 2023/0006125 A1 | 1/2023 | Goto et al. | |
| 2023/0006636 A1 | 1/2023 | Goto et al. | |
| 2023/0006637 A1 | 1/2023 | Goto et al. | |
| 2023/0013597 A1 | 1/2023 | Goto et al. | |
| 2023/0016884 A1 | 1/2023 | Goto et al. | |
| 2023/0031568 A1 | 2/2023 | Tang et al. | |
| 2023/0032325 A1 | 2/2023 | Goto et al. | |
| 2023/0036775 A1 | 2/2023 | Goto et al. | |
| 2023/0048476 A1 | 2/2023 | Cheng et al. | |
| 2023/0055758 A1 | 2/2023 | Goto et al. | |
| 2023/0062981 A1 | 3/2023 | Fukuhara et al. | |
| 2023/0066822 A1 | 3/2023 | Fukuhara et al. | |
| 2023/0069327 A1 | 3/2023 | Fukuhara et al. | |
| 2023/0070350 A1 | 3/2023 | Goto | |
| 2023/0101360 A1 | 3/2023 | Fujiwara et al. | |
| 2023/0103956 A1 | 4/2023 | Fukuhara et al. | |
| 2023/0104257 A1 | 4/2023 | Barsukou et al. | |
| 2023/0104405 A1 | 4/2023 | Hiramatsu et al. | |
| 2023/0104500 A1 | 4/2023 | Fukuhara et al. | |
| 2023/0105034 A1 | 4/2023 | Fukuhara et al. | |
| 2023/0107376 A1 | 4/2023 | Goto et al. | |
| 2023/0107728 A1 | 4/2023 | Fukuhara et al. | |
| 2023/0107820 A1 | 4/2023 | Fukuhara et al. | |
| 2023/0108686 A1 | 4/2023 | Fukuhara et al. | |
| 2023/0109106 A1 | 4/2023 | Hiramatsu et al. | |
| 2023/0110477 A1 | 4/2023 | Maki et al. | |
| 2023/0111032 A1 | 4/2023 | Goto et al. | |
| 2023/0111476 A1 | 4/2023 | Fukuhara et al. | |
| 2023/0111849 A1 | 4/2023 | Maki et al. | |
| 2023/0113099 A1 | 4/2023 | Goto et al. | |
| 2023/0117464 A1 | 4/2023 | Goto et al. | |
| 2023/0118194 A1 | 4/2023 | Goto et al. | |
| 2023/0119788 A1 | 4/2023 | Goto et al. | |
| 2024/0039508 A1 | 2/2024 | Zheng et al. | |

OTHER PUBLICATIONS

Chen et al., "Theoretical analysis of surface acoustic wave propagating properties of Y-cut nano lithium niobate film on silicon dioxide", AIP Advances, 5:087173-1-5 (2015).

(56) References Cited

OTHER PUBLICATIONS

Ciplys et al., "Measurements of electromechanical coupling coefficient for surface acoustic waves in proton-exchanged lithium niobate", Ultragarsas/Ultrasound Nr 3(33):14-20 (1999).
Hickernell et al., "The surface acoustic wave propagation characteristics of 64/spl deg/YX LiNbO/sub 3/and 36/spl deg/ YX LiTaO/sub 3/substrates with thin-film SiO/sub 2", 1995 IEEE Ultrasonics Symposium, Proceedings, An International Symposium vol. 1 (1995).
Plessky et al., "Crystalline Y-cut lithium niobate layers for the bulk acoustic wave resonator (YBAR)", 2020 IEEE Interational Ultrasonics Symposium (IUS), pp. 1-4 (2020).

* cited by examiner

ESTIMATED ENERGY DISTRIBUTION

Tr2 REAL: Y(1,1) SCALE: 10.00/Div Ref −50.00

FREQUENCY: 840.0MHz... 1.000GHz

—— HH DF 0.40−0.45
----- HH DF 0.40−0.49
—▬— HH DF 0.40−0.53
——— BASELINE (W/O BOTTOM SiO2)

Tr1 dB: Y(1,1) SCALE: 10.00/Div Ref −30.00dB

FREQUENCY: 840.0MHz... 1.000GHz

Tr3 Q: Y(1,1) SCALE: 500.0/Div Ref 0.000

FREQUENCY: 840.0MHz... 1.000GHz

Tr2 REAL: Y(1,1)  SCALE: 10.00/Div  Ref −50.00

−50.00
−60.00
−70.00
−80.00
−90.00
−100.0
−110.0
−120.0
−130.0
−140.0
−150.0

FREQUENCY: 840.0MHz... 1.000GHz

BOTTOM SiO2 0.008L
BOTTOM SiO2 0.016L
W/O BOTTOM SiO2

Tr1 dB: Y(1,1)  SCALE: 10.00/Div  Ref −30.00dB

−30.00
−40.00
−50.00
−60.00
−70.00
−80.00
−90.00
−100.0
−110.0
−120.0
−130.0

FREQUENCY: 840.0MHz... 1.000GHz

Tr3 Q: Y(1,1)  SCALE: 500.0/Div  Ref 0.000

5.00k
4.50k
4.00k
3.50k
3.00k
2.50k
2.00k
1.50k
1.00k
500.0
0.000

FREQUENCY: 840.0MHz... 1.000GHz

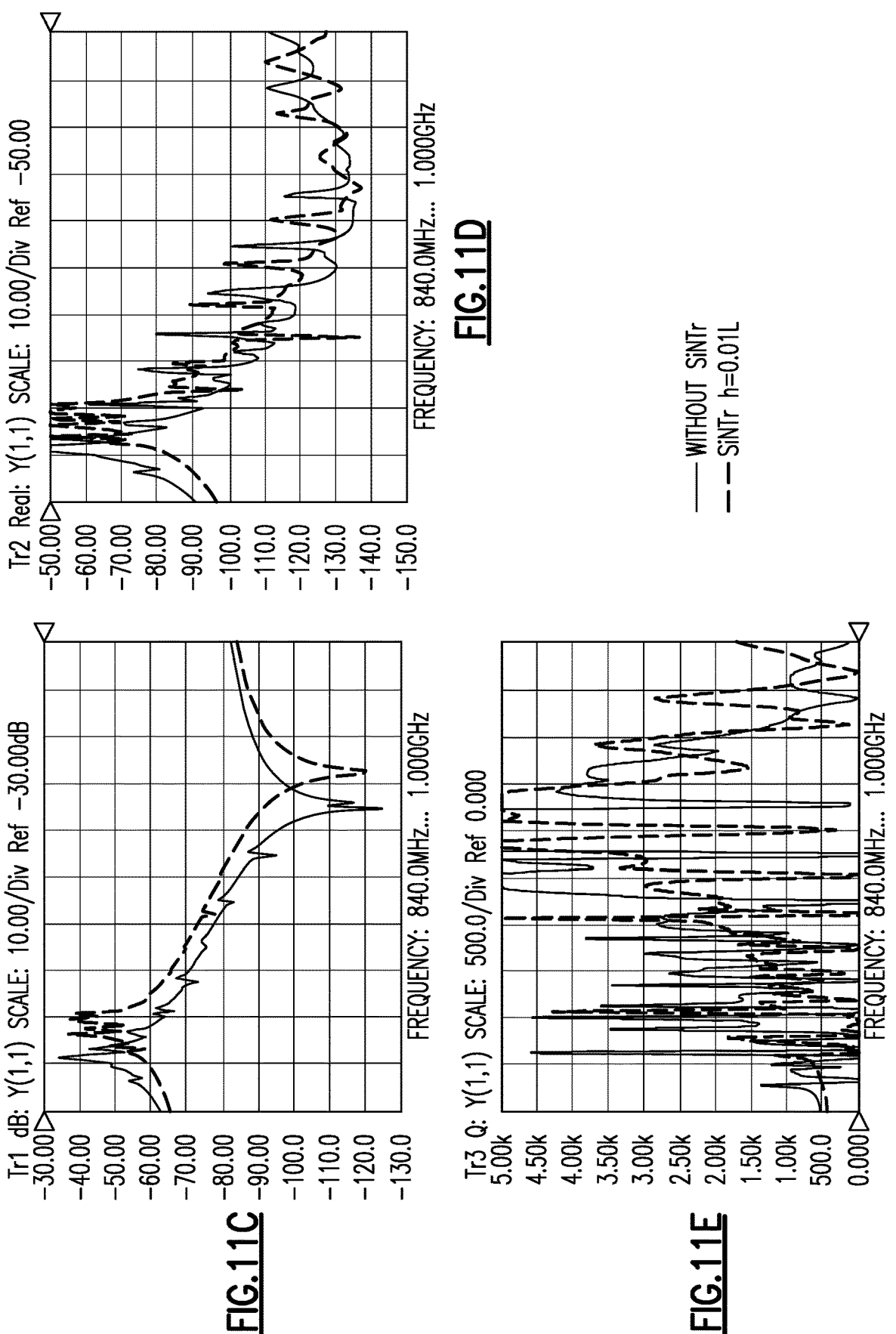

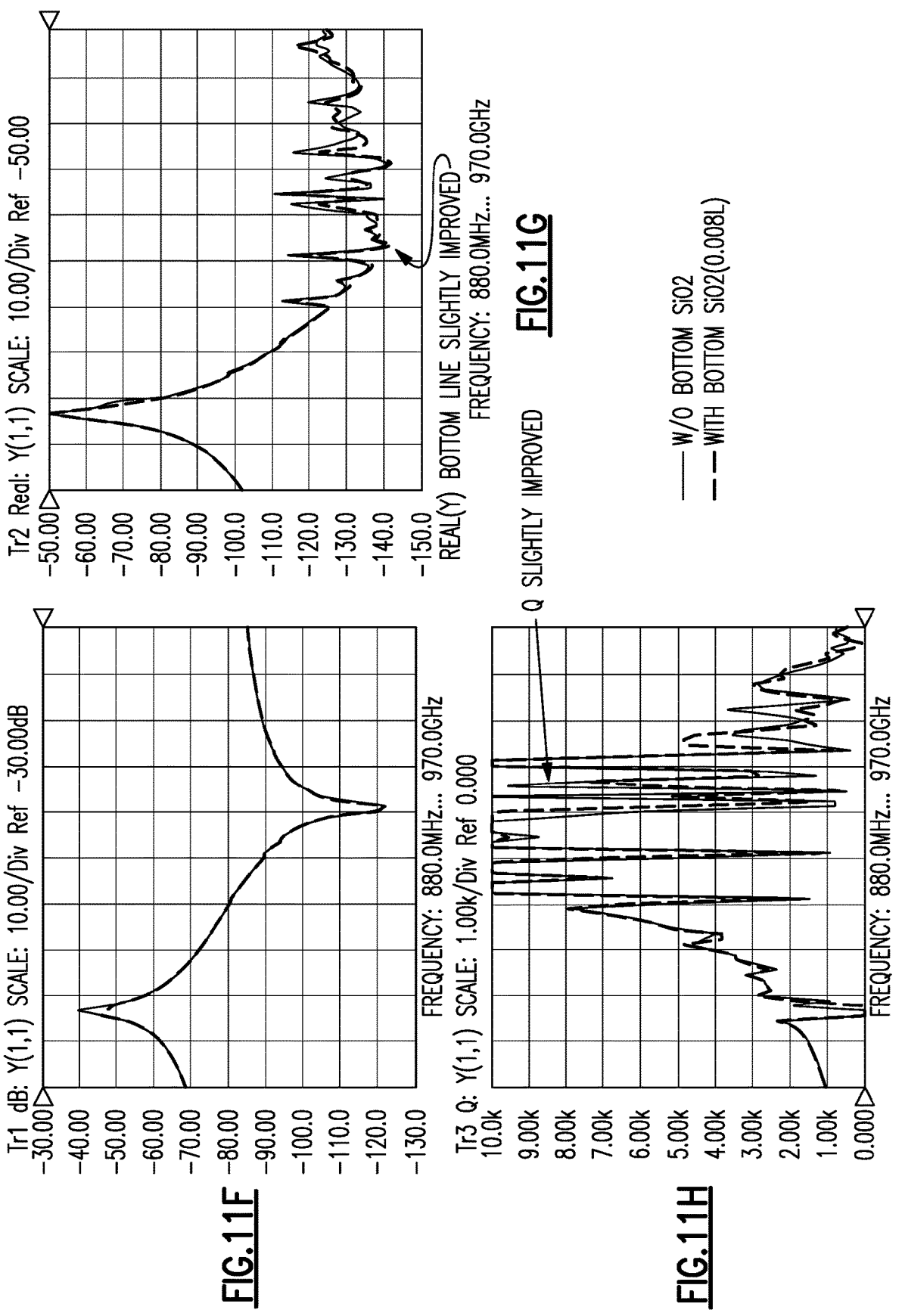

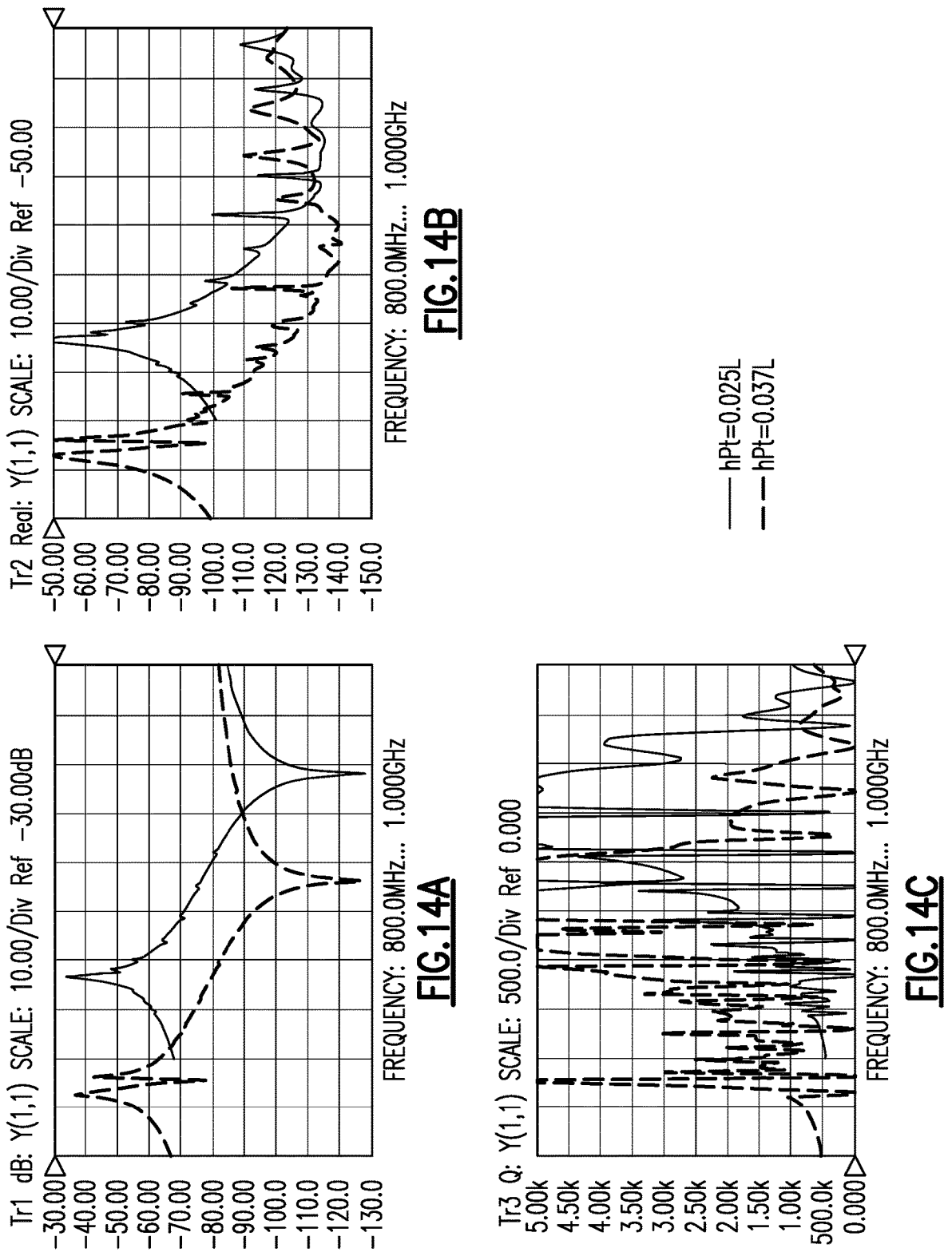

Tr2 Real: Y(1,1) SCALE: 10.00/Div Ref −50.00

−50.00
−60.00
−70.00
−80.00
−90.00
−100.0
−110.0
−120.0
−130.0
−140.0
−150.0

FREQUENCY: 800.0MHz... 1.000GHz hPt=0.037L

——— −15YX−LN
——— −10YX−LN
— — — −5YX−LN
— ·— · −0YX−LN

Tr1 dB: Y(1,1) SCALE: 10.00/Div Ref −30.00dB

−30.00
−40.00
−50.00
−60.00
−70.00
−80.00
−90.00
−100.0
−110.0
−120.0
−130.0

FREQUENCY: 800.0MHz... 1.000GHz

Tr3 Q: Y(1,1) SCALE: 500.0/Div Ref 0.000

5.00k
4.50k
4.00k
3.50k
3.00k
2.50k
2.00k
1.50k
1.00k
500.0k
0.000

FREQUENCY: 800.0MHz... 1.000GHz

Tr2 Real: Y(1,1) SCALE: 10.00/Div Ref −50.00

FREQUENCY: 840.0MHz... 1.000GHz

—— W/O FINGER NAIL
------ WITH FINGER NAIL
(W=0.5L, hPt=0.01L)

Tr1 dB: Y(1,1) SCALE: 10.00/Div Ref −30.00dB

FREQUENCY: 840.0MHz... 1.000GHz

Tr3 Q: Y(1,1) SCALE: 500.0/Div Ref 0.000

FREQUENCY: 840.0MHz... 1.000GHz

ACOUSTIC WAVE DEVICE WITH DIELECTRIC LAYER FOR REDUCED TRANSVERSE LEAKAGE

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/227,900, filed Jul. 30, 2021, titled "ACOUSTIC WAVE DEVICE WITH DIELECTRIC LAYER FOR TRANSVERSE LEAKAGE SUPPRESSION," and U.S. Provisional Patent Application No. 63/227,913, filed Jul. 30, 2021, titled "ACOUSTIC WAVE DEVICE WITH DIELECTRIC LAYER FOR REDUCED TRANSVERSE LEAKAGE," are hereby incorporated by reference under 37 CFR 1.57 in their entirety.

BACKGROUND

Technical Field

Embodiments of this disclosure relate to acoustic wave devices.

Description of Related Technology

A surface acoustic wave filter can include a plurality of surface acoustic wave resonators arranged to filter a radio frequency signal. Each resonator can include a surface acoustic wave device. Example surface acoustic wave device include temperature compensated surface acoustic wave device. A surface acoustic wave device can be configured to generate, for example, a Rayleigh mode surface acoustic wave or a shear horizontal mode surface acoustic wave.

Surface acoustic wave filters can be implemented in radio frequency electronic systems. For instance, filters in a radio frequency front end of a mobile phone can include surface acoustic wave filters. A plurality of acoustic wave filters can be arranged as a multiplexer. For example, two surface acoustic wave filters can be arranged as a duplexer. Transverse leakage generally degrades the performance of the surface acoustic wave device.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a piezoelectric layer, an interdigital transducer electrode over the piezoelectric layer, a temperature compensation layer over the interdigital transducer electrode, and a dielectric layer positioned in a first area between the piezoelectric layer and the interdigital transducer electrode. The dielectric layer positioned so as to suppress transverse leakage of acoustic energy generated by the acoustic wave device. A second area between the piezoelectric layer and the interdigital transducer electrode is free from the dielectric layer. The acoustic wave device configured to generate an acoustic wave.

In one embodiment, the interdigital transducer electrode includes an active region that has a center region and an edge region, a bus bar, and a gap region between the active region and the bus bar. At least a portion of the center region corresponds to the second area. The dielectric layer can be positioned under the edge region and the gap region. The dielectric layer can be positioned under a location at or near an interface between the edge region and the gap region. The acoustic wave has a wavelength of L, and the edge region can be a region within 0.5L to 1.2L into the active region from the gap region. The interdigital transducer electrode can have a hammer head shape that has a finger width at the edge region greater than a finger width at the center region. The acoustic wave device can further include a mini bus bar in the gap region.

In one embodiment, a material of the temperature compensation layer and a material of the dielectric layer are the same.

In one embodiment, the dielectric layer includes silicon dioxide.

In one embodiment, the piezoelectric layer is a lithium niobate layer having a cut angle in a range of −20° YX to 25° YX.

In one embodiment, a shear horizontal mode is a main mode of the surface wave device.

In one embodiment, a Rayleigh mode is a main mode of the surface wave device.

In one embodiment, the surface acoustic wave has a wavelength of L, and the dielectric layer has a thickness in a range from 0.005L to 0.02L.

In one embodiment, the acoustic wave device further includes a piston mode structure that is configured to suppress a transverse mode of the acoustic wave generated by the surface acoustic wave device.

In one aspect, a surface acoustic wave device is disclosed. The surface acoustic wave device can include a lithium niobate layer having a cut angle in a range of −20° YX to 25° YX, an interdigital transducer electrode over the piezoelectric layer, a temperature compensation layer over the interdigital transducer electrode, and a dielectric layer that is positioned in a first area between the piezoelectric layer and a first region of the interdigital transducer electrode. The dielectric layer is positioned so as to suppress transverse leakage of acoustic energy generated by the surface acoustic wave device and maintaining a coupling factor of an acoustic wave generated by the surface acoustic wave.

In one embodiment, the interdigital transducer electrode includes an active region that has a center region and an edge region, a bus bar, and a gap region between the active region and the bus bar. A portion between the center region and the piezoelectric layer is free from the dielectric layer. A portion between the bus bar and the piezoelectric layer can be free from the dielectric layer.

In one embodiment, the surface acoustic wave has a wavelength of L, and the dielectric layer has a thickness in a range from 0.005L to 0.02L.

In one embodiment, the surface acoustic wave device further includes a piston mode structure to suppress a transverse mode of the acoustic wave generated by the surface acoustic wave device. A packaged module that includes a substrate that supports at least one filter is disclosed. The at least one filter includes at least one acoustic wave device disclosed herein. The packaged module can be a radio frequency front end module. The packaged module can be a diversity receive module.

In one embodiment, a wireless communication device includes an antenna, a transceiver, and one or more of the packaged modules and/or acoustic wave devices disclosed herein.

In one aspect, an acoustic wave device is disclosed. The acoustic wave device can include a piezoelectric layer and an interdigital transducer electrode over the piezoelectric layer. The interdigital transducer electrode includes an active region that has a center region and an edge region, a bus bar, and a gap region between the active region and the bus bar. At least a portion of the center region is in direct physical contact with the piezoelectric layer. The acoustic wave device can include a temperature compensation layer over the interdigital transducer electrode, and a dielectric layer that is positioned partially between the piezoelectric layer and the interdigital transducer electrode. The acoustic wave device is configured to generate an acoustic wave.

In one embodiment, the dielectric layer is positioned so as to suppress transverse leakage of acoustic energy generated by the acoustic wave device.

In one embodiment, the dielectric layer is positioned under the edge region and the gap region.

In one embodiment, the dielectric layer is positioned under a location at or near an interface between the edge region and the gap region.

In one embodiment, the acoustic wave device further includes a mini bus bar in the gap region.

In one embodiment, a material of the temperature compensation layer and a material of the dielectric layer are the same.

In one embodiment, the dielectric layer includes silicon dioxide.

In one embodiment, the piezoelectric layer is a lithium niobate layer having a cut angle in a range from –20° YX to 25° YX.

In one embodiment, a shear horizontal mode is a main mode of the acoustic wave device.

In one embodiment, a Rayleigh mode is a main mode of the acoustic wave device.

In one embodiment, the acoustic wave has a wavelength of L, and the dielectric layer has a thickness in a range from 0.005L to 0.02L.

In one embodiment, the acoustic wave device further includes a piston mode structure that is configured to suppress a transverse mode of the acoustic wave generated by the acoustic wave device.

In one aspect, a surface acoustic wave device is disclosed. The surface acoustic wave device can include a lithium niobate layer having a cut angle in a range of –20° YX to 25° YX, and an interdigital transducer electrode over the piezoelectric layer. The interdigital transducer electrode includes an active region that has a center region and an edge region, a bus bar, and a gap region between the active region and the bus bar. At least a portion of the center region is in direct physical contact with the piezoelectric layer. The surface acoustic wave device can include a temperature compensation layer over the interdigital transducer electrode, and a dielectric layer that is selectively positioned under a location at or near an interface between the edge region and the gap region. The surface acoustic wave device is configured to generate a surface acoustic wave.

In one embodiment, the surface acoustic wave has a wavelength of L, and the dielectric layer is selectively positioned under an area that is within 0.5L to 1.2L into the edge region from the gap region and an area that is within 0.5L to 1.2L into the gap region from the edge region.

In one embodiment, the surface acoustic wave has a wavelength of L, and the dielectric layer has a thickness in a range from 0.005L to 0.02L.

In one embodiment, the surface acoustic wave device further includes a piston mode structure that is configured to suppress a transverse mode of the surface acoustic wave generated by the surface acoustic wave device In one embodiment, a packaged module that includes a substrate that supports at least one filter. The at least one filter includes at least one acoustic wave device disclosed herein. The packaged module can be a radio frequency front end module. The packaged module can be a diversity receive module.

In one embodiment, a wireless communication device includes an antenna, a transceiver, and one or more of the packaged modules and/or acoustic wave devices disclosed herein.

In one aspect, an acoustic wave device is disclosed. The acoustic wave device can include a piezoelectric layer, an interdigital transducer electrode over the piezoelectric layer, a temperature compensation layer over the interdigital transducer electrode, and a dielectric layer that is positioned partially between the piezoelectric layer and the interdigital transducer electrode. The dielectric layer is positioned so as to partially electro-mechanically de-couple the piezoelectric layer from the interdigital transducer electrode. The acoustic wave device is configured to generate an acoustic wave.

In one embodiment, the dielectric layer is positioned in a first area between the piezoelectric layer and the interdigital transducer electrode so as to suppress transverse leakage of acoustic energy generated by the acoustic wave device.

In one embodiment, a second area between the piezoelectric layer and the interdigital transducer electrode being free from the dielectric layer. The interdigital transducer electrode can include an active region that has a center region and an edge region, a bus bar, and a gap region between the active region and the bus bar. At least a portion of the center region corresponds to the second area. The dielectric layer can be positioned under the edge region and the gap region. The dielectric layer can be positioned under a location at or near an interface between the edge region and the gap region. The acoustic wave has a wavelength of L, and the edge region can be a region within 0.5L to 1.2L into the active region from the gap region. The interdigital transducer electrode can have a hammer head shape that has a finger width at the edge region greater than a finger width at the center region. The acoustic wave device can further include a mini bus bar in the gap region.

In one embodiment, a material of the temperature compensation layer and a material of the dielectric layer are the same.

In one embodiment, the dielectric layer includes silicon dioxide.

In one embodiment, the piezoelectric layer is a lithium niobate layer having a cut angle in a range of –20° YX to 25° YX.

In one embodiment, a shear horizontal mode is a main mode of the surface wave device.

In one embodiment, a Rayleigh mode is a main mode of the surface wave device.

In one embodiment, the surface acoustic wave has a wavelength of L, and the dielectric layer has a thickness in a range from 0.005L to 0.02L.

In one embodiment, the acoustic wave device further includes a piston mode structure that is configured to suppress a transverse mode of the acoustic wave generated by the surface acoustic wave device.

In one aspect, an acoustic wave device is disclosed. The acoustic wave device can include a piezoelectric layer, a dielectric layer partially on the piezoelectric layer, and an interdigital transducer electrode that includes an active region having a center region and an edge region, a bus bar, and a gap region between the active region and the bus bar. At least a portion of the center region disposed directly on the piezoelectric layer and at least a portion of the edge region disposed directly on the dielectric layer so as to electro-mechanically de-couple the piezoelectric layer from the portion of the edge region of the interdigital transducer electrode. The acoustic wave device can include a temperature compensation layer over the interdigital transducer electrode. The acoustic wave device is configured to generate an acoustic wave.

In one embodiment, the dielectric layer is positioned under the edge region and the gap region.

In one embodiment, the dielectric layer is positioned under a location at or near an interface between the edge region and the gap region.

In one embodiment, the acoustic wave has a wavelength of L, and the edge region is a region within 0.5L to 1.2L into the active region from the gap region.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/816,075, titled "ACOUSTIC WAVE DEVICE WITH DIELECTRIC LAYER FOR TRANSVERSE LEAKAGE SUPPRESSION," filed on Jul. 29, 2022, and U.S. patent application Ser. No. 17/816,083, titled "DIELECTRIC LAYER IN ACOUSTIC WAVE DEVICE FOR ELECTRO-MECHANICALLY DE-COUPLING," filed on Jul. 29, 2022, the entire disclosure of which are hereby incorporated by reference herein.

BRIEF DESCRIPTION OF THE DRAWINGS

Embodiments of this disclosure will now be described, by way of non-limiting example, with reference to the accompanying drawings.

FIGS. 11F-11H are graphs showing simulated frequency responses of various surface acoustic wave devices.

FIGS. 14A-14C are graphs showing simulated frequency responses of surface acoustic wave devices according to various embodiments.

DETAILED DESCRIPTION OF CERTAIN EMBODIMENTS

Figure 1A:
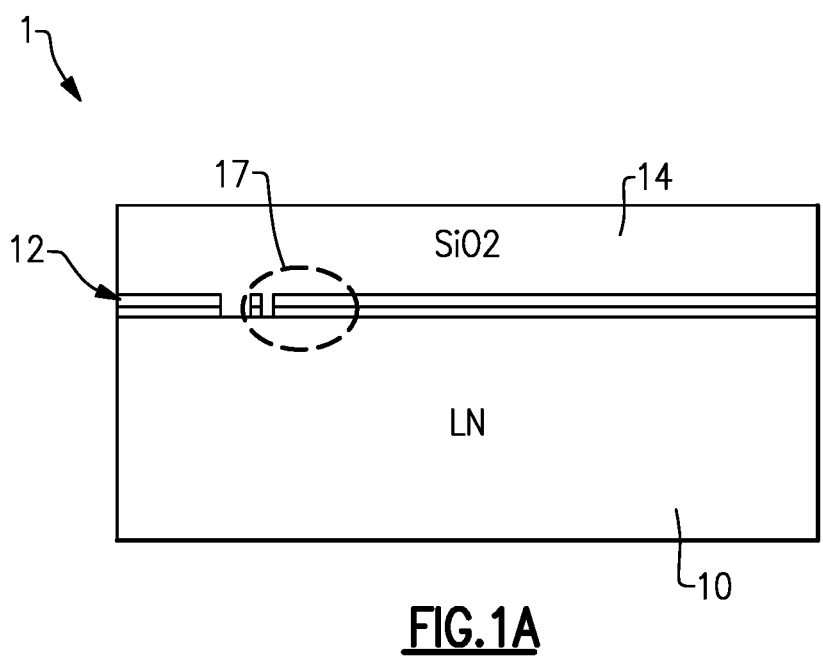
FIG. 1A is a schematic cross-sectional side view of a surface acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The surface acoustic wave devices include SAW resonators, SAW delay lines, and multi-mode SAW (MMS) filters (e.g., double mode SAW (DMS) filters).

In general, high quality factor (Q), large effective electromechanical coupling coefficient or coupling factor ($K^2$), high frequency ability, and spurious free can be significant aspects for micro resonators to enable low-loss filters, stable oscillators, and sensitive sensors. With a relatively low cut angle lithium niobate piezoelectric layer, the main mode of an acoustic wave of a surface acoustic wave device can be a shear horizontal mode. A surface acoustic wave device having a relatively low cut angle lithium niobate (LN or $LiNbO_3$) for its piezoelectric layer can achieve relatively large effective electromechanical coupling coefficient as compared to LN with a 128° rotated Y-cut, X-propagating cut angle (128° YX-LN). For example, the low cut angle lithium niobate layer can have a cut angle in a range from −20° to 25° rotated Y-cut, X-propagating (−20° to 25° YX-LN). However, the quality factor may be degraded in such a surface acoustic wave device with a relatively low cut angle LN.

One of the causes for quality factor degradation is transverse leakage of acoustic energy in the surface acoustic wave device. A silicon dioxide (SiO2) layer can be provided entirely between the interdigital transducer electrode and the piezoelectric layer to suppress the transverse leakage, to thereby increase the quality factor. However, the coupling factor of such surface acoustic wave device with the silicon dioxide layer can be significantly degraded.

In the present disclosure, a selectively positioned intermediate dielectric layer is used to improve the quality factor without significantly degrading the coupling factor. The selectively positioned intermediate dielectric layer can be implemented in various acoustic wave devices, such as shear horizontal mode acoustic wave devices and Rayleigh mode acoustic wave devices. The intermediate dielectric layer can be positioned partially between a piezoelectric layer and an interdigital transducer electrode. For example, a portion of the piezoelectric layer under a center region of the interdigital transducer electrode can be free from the intermediate dielectric layer while at least some of other portions between the piezoelectric layer and the interdigital transducer electrode include the intermediate dielectric layer.

A shear horizontal mode acoustic wave device can include a low cut lithium niobate piezoelectric layer, such as a lithium niobate layer that is in a 0° YX-LN group. The 0° YX-LN group can include a lithium niobate with a cut angle in a range from, for example, −20° to 25° rotated Y-cut, X-propagating (−20° to 25° YX-LN). The 0° YX-LN group can also include a lithium niobate layer with a cut angle in Euler angle (φ, θ, ψ) of −15<φ<15, 90−20<θ<90+25, −15<ψ<15. A Rayleigh mode acoustic wave device can include a high cut lithium niobate piezoelectric layer, such as a lithium niobate layer that is in a 128° YX-LN group. The 128° YX-LN group can include a lithium niobate with a cut angle in a range from, for example, 115° to 135° rotated Y-cut, X-propagating (115° to 135° YX-LN). 115° to 135° YX-LN can be expressed in Euler angle (φ, θ, ψ) as φ=0, 90+115<θ<90+135, ψ=0. The 128°YX-LN group can also include a lithium niobate layer with a cut angle in Euler angle (φ, θ, ψ) of −15<φ<15, 90+115<θ<90+135, −15<ψ<15.

FIG. 1A is a schematic cross-sectional side view of a surface acoustic wave device 1. The acoustic wave device 1 includes a lithium niobate layer 10 having a 0° rotated Y-cut, X-propagating (0° YX) cut angle. The surface acoustic wave device 1 is a shear horizontal surface acoustic wave device that is configured to mainly generate a shear horizontal mode surface acoustic wave. The acoustic wave device 1 also includes an interdigital transducer electrode 12 on the lithium niobate layer 10, and a silicon dioxide (SiO₂) layer 14 over the interdigital transducer electrode 12.

Figure 1B:
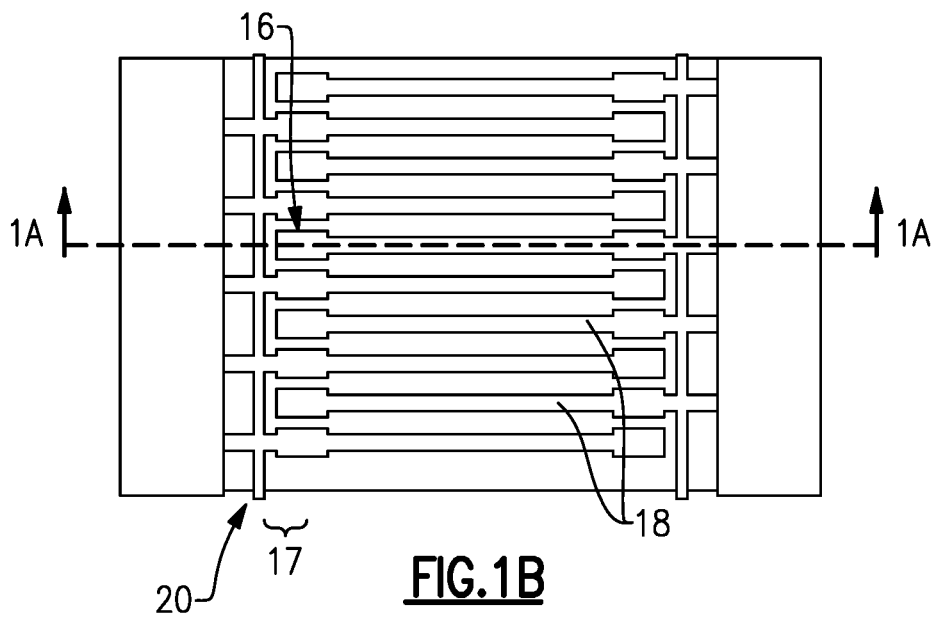
FIG. 1B is a schematic top plan view of the surface acoustic wave device of FIG. 1A.

FIG. 1B is a schematic top plan view of the surface acoustic wave device 1. The silicon dioxide layer 14 is omitted in FIG. 1B. The interdigital transducer electrode 12 includes a hammer head structure 16 that has a wider finger width at an edge region 17 of fingers 18 of the interdigital transducer electrode 12. The interdigital transducer electrode 12 also includes a mini bus bar. Both the hammer head structure and the mini bus bar are example piston mode structures and can contribute to suppressing a transverse mode in a frequency response.

Figure 2A:
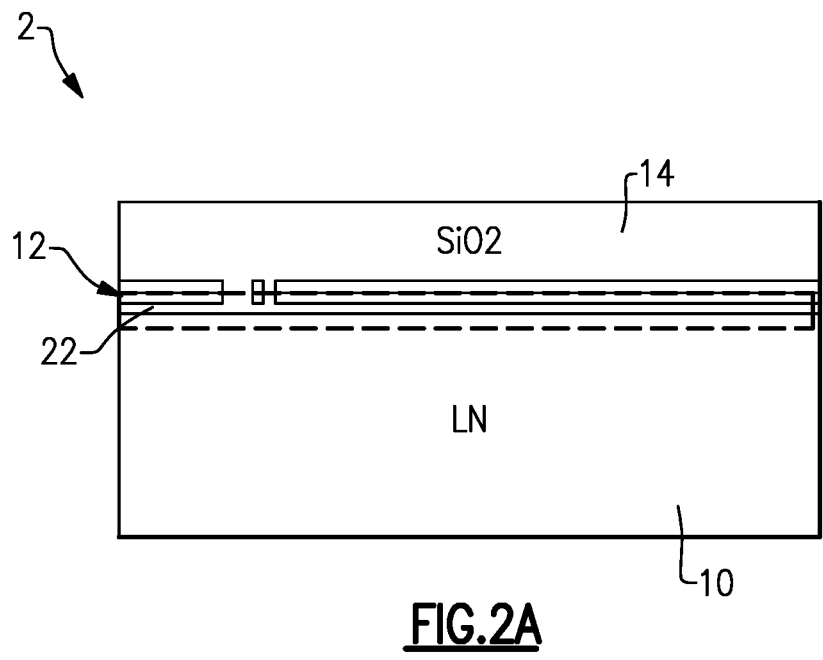
FIG. 2A is a schematic cross-sectional side view of another surface acoustic wave device.
Figure 2B:
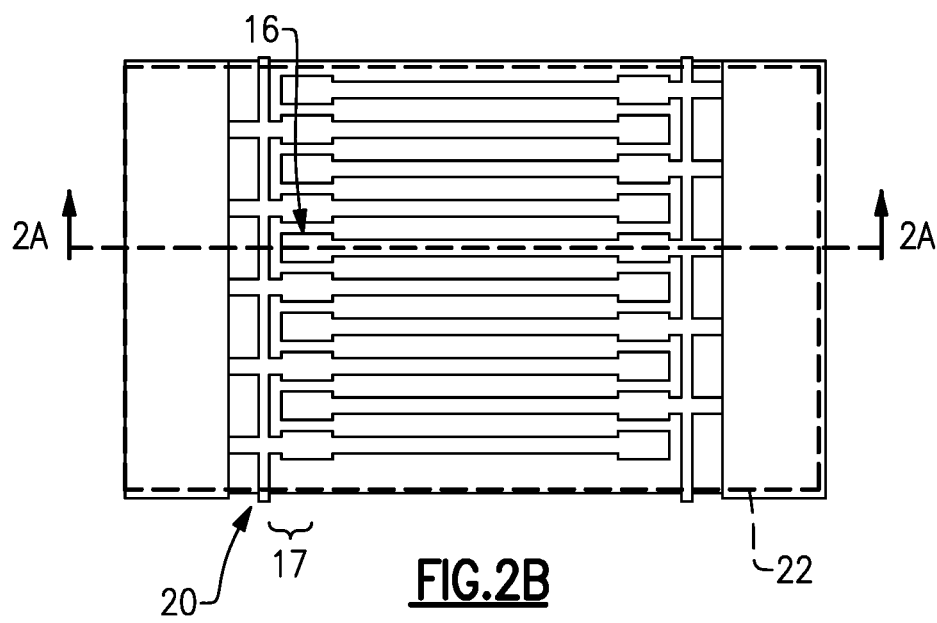
FIG. 2B is a schematic top plan view of the surface acoustic wave device of FIG. 2A.

FIG. 2A is a schematic cross-sectional side view of a surface acoustic wave device 2. FIG. 2B is a schematic top plan view of the surface acoustic wave device 2. The surface acoustic wave device 2 is generally similar to the surface acoustic wave device 1 of FIGS. 1A and 1B, except in the surface acoustic wave device 2, an intermediate silicon oxide layer 22 is included between the lithium niobate layer 10 and the interdigital transducer electrode 12. The intermediate silicon oxide layer 22 covers an entire upper surface of the lithium niobate layer 10. Therefore, the interdigital transducer electrode 12 is entirely separated by the intermediate silicon oxide layer 22 from the lithium niobate layer 10. In other words, the interdigital transducer electrode 12 does not make any physical direct contact with the lithium niobate layer 10.

Figure 3A:
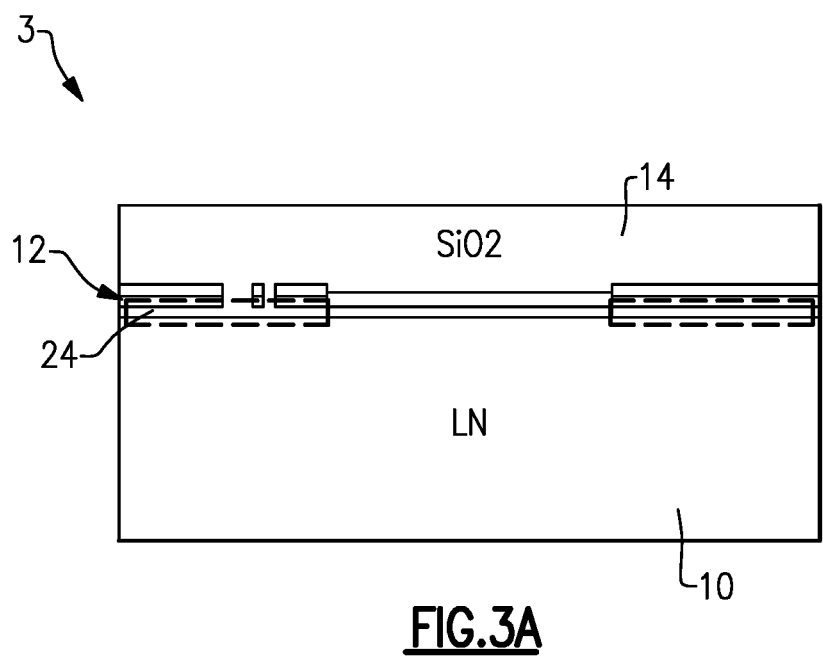
FIG. 3A is a schematic cross-sectional side view of a surface acoustic wave device according to an embodiment.
Figure 3B:
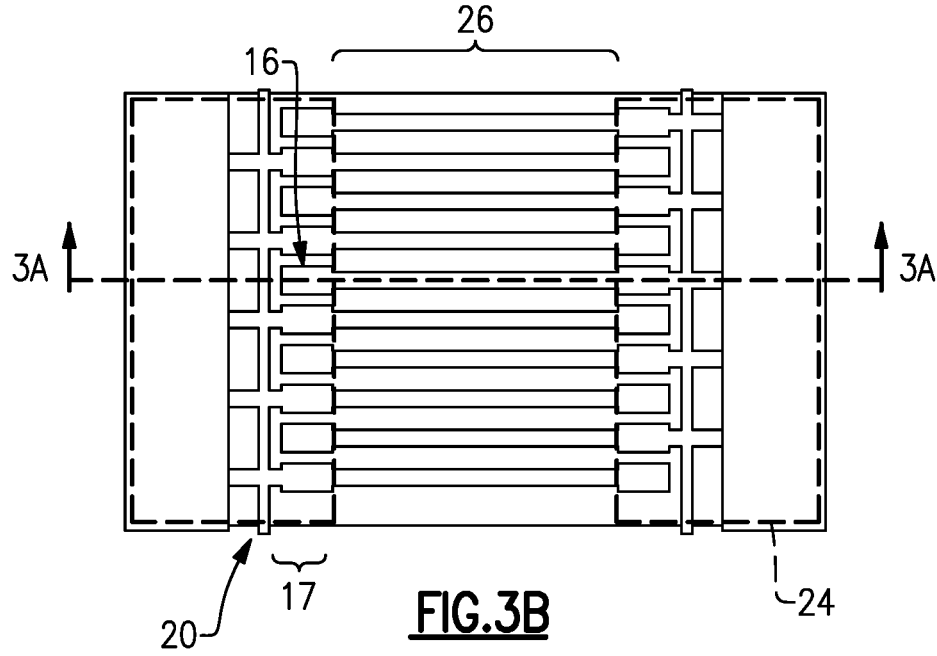
FIG. 3B is a schematic top plan view of the surface acoustic wave device of FIG. 3A.

FIG. 3A is a schematic cross-sectional side view of a surface acoustic wave device 3 according to an embodiment. FIG. 3B is a schematic top plan view of the surface acoustic wave device 3. In the surface acoustic wave device 3, an intermediate silicon oxide layer 24 is selectively positioned between the lithium niobate layer 10 and an area under a first region of the interdigital transducer electrode 12. The first region can correspond to at least one of the regions indicated by dashed lines. The silicon dioxide layer 24 is an example of a dielectric layer positioned between part of the interdigital transducer electrode 12 and the lithium niobate layer 10. In the surface acoustic wave device 3, the intermediate silicon oxide layer 24 is selectively positioned such that an area under a center region 26 (a second region) of the interdigital transducer electrode 12 is free from the intermediate silicon oxide layer 24. The silicon dioxide layer 14 can serve as a temperature compensation layer in the surface acoustic wave device 3.

Figures 4A, 4B, 4C:
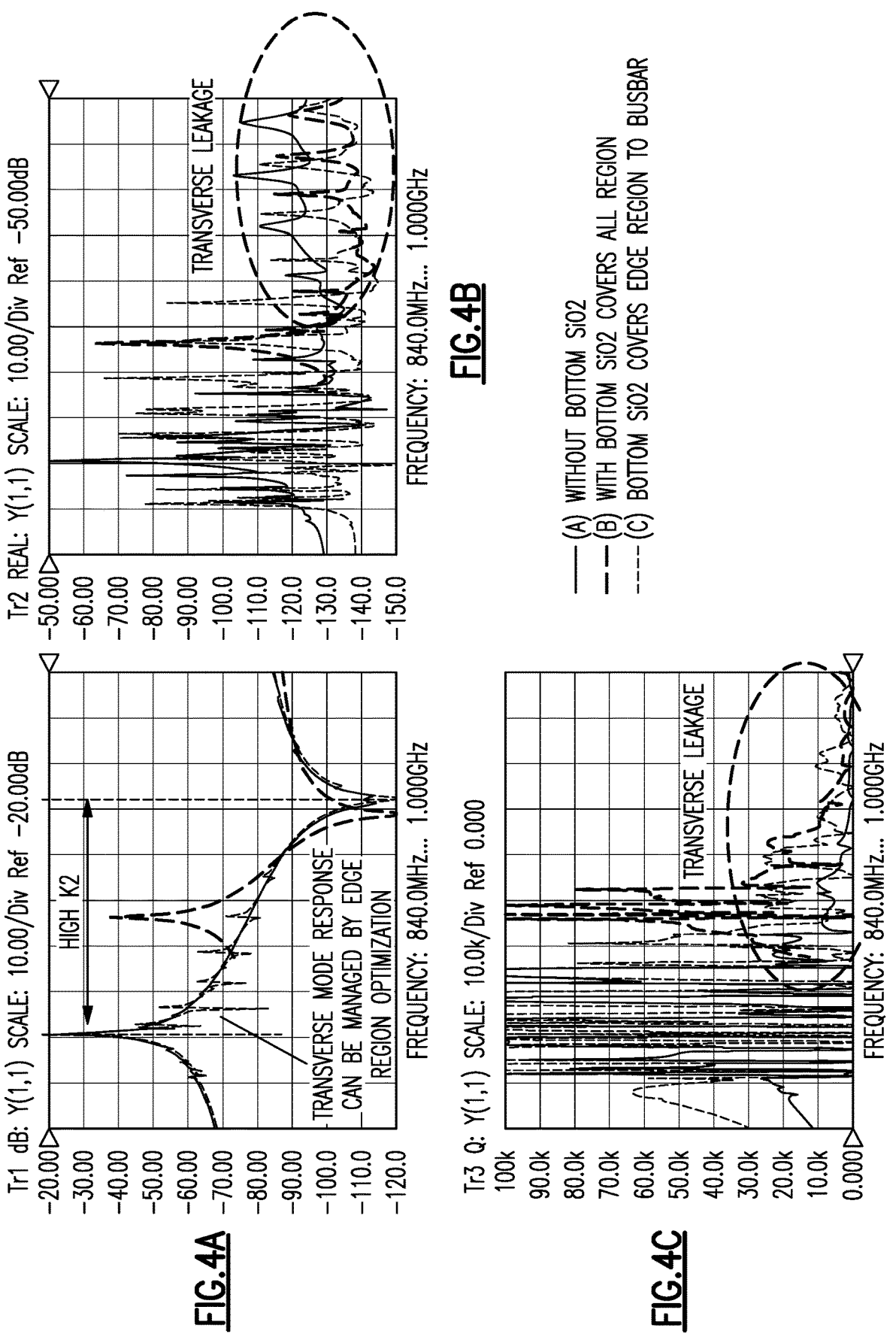
FIGS. 4A-4C are graphs showing simulated frequency responses of the surface acoustic wave devices of FIGS. 1A-3B.

FIGS. 4A-4C are graphs showing simulated frequency responses of the surface acoustic wave devices 1, 2, 3. FIG. 4A shows that a coupling factor K$^2$ of the surface acoustic wave device 2 is significantly smaller than those of the surface acoustic wave devices 1, 3. FIG. 4B shows that there is a higher transverse leakage of the acoustic energy in the surface acoustic wave device 1 than the surface acoustic wave devices 2, 3. The simulation results indicate that the transverse leakage is suppressed in the surface acoustic wave devices 2, 3. FIG. 4C shows that the quality factor of the surface acoustic wave device 1 is lower than the surface acoustic wave devices 2, 3. The simulation results indicate that the quality factors of the surface acoustic wave devices 2, 3 are improved relative to the surface acoustic wave device 1. The improvement in the quality factor can be due to the suppression of the transverse leakage. These simulation results indicate that the surface acoustic wave device 3 has a relatively high coupling factor K2 and a relatively high quality factor.

Figures 5A, 5B:
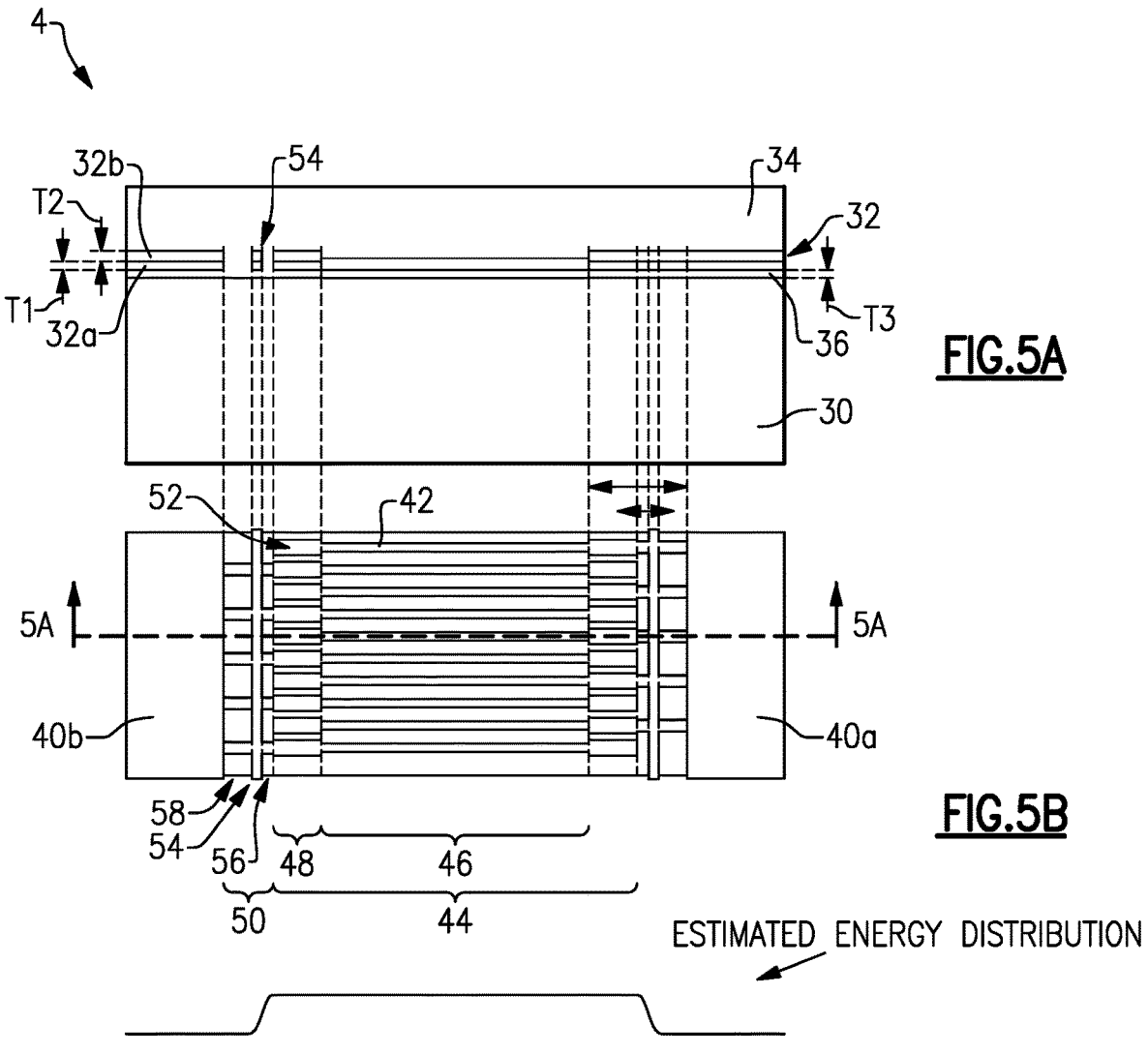
FIG. 5A is a cross-sectional side view of a surface acoustic wave device according to an embodiment.
FIG. 5B is a schematic top plan view of the surface acoustic wave device of FIG. 5A FIGS. 6A-6C are graphs showing simulated frequency responses of various surface acoustic wave devices.

FIG. 5A is a cross-sectional side view of a surface acoustic wave device 4 according to an embodiment. FIG. 5B is a schematic top plan view of the surface acoustic wave device 4. The surface acoustic wave device 4 is generally similar to the surface acoustic wave device 3 of FIGS. 3A and 3B. The surface acoustic wave device 4 can be a shear horizontal surface acoustic wave device that is configured to mainly generate a shear horizontal mode surface acoustic wave. However, in some embodiments, the surface acoustic wave device 4 can be a Rayleigh surface acoustic wave device that is configured to mainly generate a Rayleigh mode surface acoustic wave. The acoustic wave device 4 includes a piezoelectric layer 30, an interdigital transducer electrode 32 over the piezoelectric layer 30, a temperature compensation layer 34 over the interdigital transducer electrode 34, and an intermediate dielectric layer 36 positioned partially between the piezoelectric layer 30 and the interdigital transducer electrode 34.

In some embodiments, the piezoelectric layer 30 may include a material such as lithium tantalate (LT) or lithium niobate (LN), although other suitable materials may also be used. For example, the piezoelectric layer 30 can be a lithium niobate (LN) layer with a rotated Y-cut, X-propagating cut angle in a range from −20° to 25° or from −10° to 0°. With the rotated Y-cut, X-propagating cut angle of a piezoelectric layer 30 that is LN being within a range from −20° to 25°, the surface acoustic wave device 4 can generate a shear horizontal mode surface acoustic wave. Use of such a piezoelectric layer to generate the shear horizontal mode surface acoustic wave can enable the surface acoustic wave device 4 to obtain a relatively high coupling factor (K$^2$). The coupling factor of the surface acoustic wave device 4 that uses a relatively low cut angle can obtain a higher coupling factor than a surface acoustic wave device with a greater cut angle.

The interdigital transducer electrode 32 can include any suitable material. For example, the interdigital transducer electrode 32 can include one or more of an aluminum (Al) layer, a molybdenum (Mo) layer, a tungsten (W) layer, a titanium (Ti) layer, a platinum (Pt) layer, a gold (Au) layer, a silver (Ag) layer, a copper (Cu) layer, a Magnesium (Mg)

layer, a ruthenium (Ru) layer, or the like. The interdigital transducer electrode 32 may include alloys, such as AlMgCu, AlCu, etc. In some embodiments, the interdigital transducer electrode 32 can be a multi-layer IDT electrode. For example, the interdigital transducer electrode 32 can be a dual layer interdigital transducer electrode that includes a first layer 32a and a second layer 32b. As an example, a multi-layer interdigital transducer electrode can include an Al layer over a Mo layer, a W layer, or a Pt layer, or a Mo layer, a W layer, or a Pt layer over an Al layer.

The interdigital transducer electrode 32 includes a bus bar 40a and a plurality of fingers 42 that extend from the bus bar 40a. The interdigital transducer electrode 32 also includes another bus bar 40b. The interdigital transducer electrode 32 includes an active region 44 that has a center region 46 and an edge region 48, and a gap region 50 between the active region 44 and the bus bar 40b. The edge region 48 can be a region near an edge of a finger 42 that is farthest from the bus bar 40a. In some embodiments, the edge region 48 is a region of the finger within 0.5L to 1.2L from the edge of the finger.

The interdigital transducer electrode 32 can have a hammer head shape 52 at or near the edge region 48. The hammer head shape 52 can provide a velocity difference between the edge region 48 and the central region 46 of an active region 44 of the interdigital transducer electrode 32, thereby facilitating a piston mode operation. The interdigital transducer electrode 32 can also include a mini bus bar 54 in the gap region 50. The mini bus bar 54 can be spaced apparat from the active region 44 by a first sub-gap region 56, and be spaced apart from the bus bar 40b by a second sub-gap region 58. The mini bus bar 54 can contribute to suppressing a transverse mode. The hammer head shape 52 and the mini bus bar 54 are examples of piston mode structures that suppress a transverse mode.

The temperature compensation layer 34 can include any suitable temperature compensation material. For example, the temperature compensation layer 34 can be a silicon dioxide (SiO$_2$) layer. The temperature compensation layer 34 can be a layer of any other suitable material having a positive temperature coefficient of frequency in instances where the piezoelectric layer 30 has a negative temperature coefficient of frequency. For instance, the temperature compensation layer 34 can be a tellurium dioxide (TeO$_2$) layer or a silicon oxyfluoride (SiOF) layer in certain applications. The temperature compensation layer 34 can include any suitable combination of SiO$_2$, TeO$_2$, and/or SiOF. The temperature compensation layer 34 can bring the TCF of the surface acoustic wave device 4 closer to zero to thereby provide temperature compensation. The temperature compensation layer 34 can improve the electromechanical coupling coefficient K$^2$ of the surface acoustic wave device 4 relative to a similar surface acoustic wave device without the temperature compensation layer 34. This advantage of the temperature compensation layer 34 can be more pronounced when the piezoelectric layer 30 includes an LN layer.

The intermediate dielectric layer 36 can include any suitable non-conductive or dielectric material. The intermediate dielectric layer 36 can be a layer that can mechanically and/or electrically separate the piezoelectric layer 30 and a portion of the interdigital transducer electrode 32, and prevent or mitigate transverse leakage of acoustic energy from the active region 44 of the interdigital transducer electrode 32. The intermediate dielectric layer 36 can electro-mechanically de-couple the piezoelectric layer 30 from a portion of the interdigital transducer electrode 32. The intermediate dielectric layer 36 can also be referred to as an energy leakage reduction layer or an energy confinement layer. For example, the intermediate dielectric layer 36 can be a silicon oxide layer (e.g., a silicon dioxide ($SiO_2$) layer). The intermediate dielectric layer 36 can be a layer of any other suitable material that can physically and/or electrically separate at least a portion of the interdigital transducer electrode 32 from the piezoelectric layer 30. For instance, the intermediate dielectric layer 36 can be a silicon nitride (SiN) layer, silicon oxynitride (SiOn) layer, an aluminum oxide ($Al_2O_3$) layer, a tantalum pentoxide ($Ta_2O_5$) layer, a tellurium dioxide ($TeO_2$) layer, a tellurium dioxide ($TeO_2$) layer or a silicon oxyfluoride (SiOF) layer in certain applications. The intermediate dielectric layer 36 can include any suitable combination of $SiO_2$, $TeO_2$, and/or SiOF. In some embodiments, the intermediate dielectric layer 36 and the temperature compensation layer 34 can include the same material. In some embodiments, the intermediate dielectric layer 36 can have a multilayer structure in which two or more dielectric layers define the intermediate dielectric layer 36.

In some embodiments, the intermediate dielectric layer 36 can be disposed in an area under a first area of the interdigital transducer electrode 32, and another area under a second area of the interdigital transducer electrode 32 can be free from the intermediate dielectric layer 36. In some embodiments, the center region 46 of the interdigital transducer electrode 32 can directly physically contact the piezoelectric layer 30 without the intermediate dielectric layer 36 disposed therebetween as shown in FIG. 5A. However, in some embodiments, intermediate dielectric layer 36 may be disposed between a portion of the center region 46 and the piezoelectric layer 30. In some embodiments, the intermediate dielectric layer 36 can be disposed anywhere under the bus bar 40a, the edge region 48, and the gap region 50.

FIG. 5B also shows an estimated energy distribution of the acoustic energy generated by the surface acoustic wave device 4. The estimated energy distribution indicates that the acoustic energy is generated mainly in the active region 44. It can be predicted that a transverse energy leakage would occur at or near a location between the gap region 50 and the active region 44. Selectively positioning the intermediate dielectric layer at or near the location between the gap region 50 and the active region 44 would enable the surface acoustic wave device 4 to obtain confined acoustic energy due to suppressed the acoustic energy leakage. In some applications, it can be beneficial to position the intermediate dielectric layer 36 under the edge region 48 and the gap region 50. In some embodiments, the dielectric layer 36 can be positioned under a location at or near an interface between the edge region 48 and the gap region 50. The location at or near the interface between the edge region 48 and the gap region 50 can include an area that is within 0.5L to 1.2L into the edge region 48 from the gap region 50 and an area that is within 0.5L to 1.2L into the gap region 50 from the edge region 48. For example, the area can be within 0.5L to 1L, 0.5L to 0.7L, 0.7L to 1.2L, or 0.7L to 1L into the edge region 48 from the gap region 50 and the area can be within 0.5L to 1L, 0.5L to 0.7L, 0.7L to 1.2L, or 0.7L to 1L into the gap region 50 from the edge region 48.

The first layer 32a of the interdigital transducer electrode 32 has a thickness T1, the second layer 32b of the interdigital transducer electrode 32 has a thickness T2. In some embodiments, the first layer 32a may include platinum, and the thickness T1 may be between about 0.02L and 0.03L, although other material and other thicknesses may also be used. In some embodiments, the second layer 32b may include aluminum, and the thickness T2 may be between about 0.03L and 0.5L, although other materials and thicknesses may also be used. The intermediate dielectric layer 36 has a thickness T3. In some embodiments, the intermediate dielectric layer 36 may include silicon dioxide, and the thickness T3 can be between about 0.005L to 0.02L.

Figures 6A, 6B, 6C:
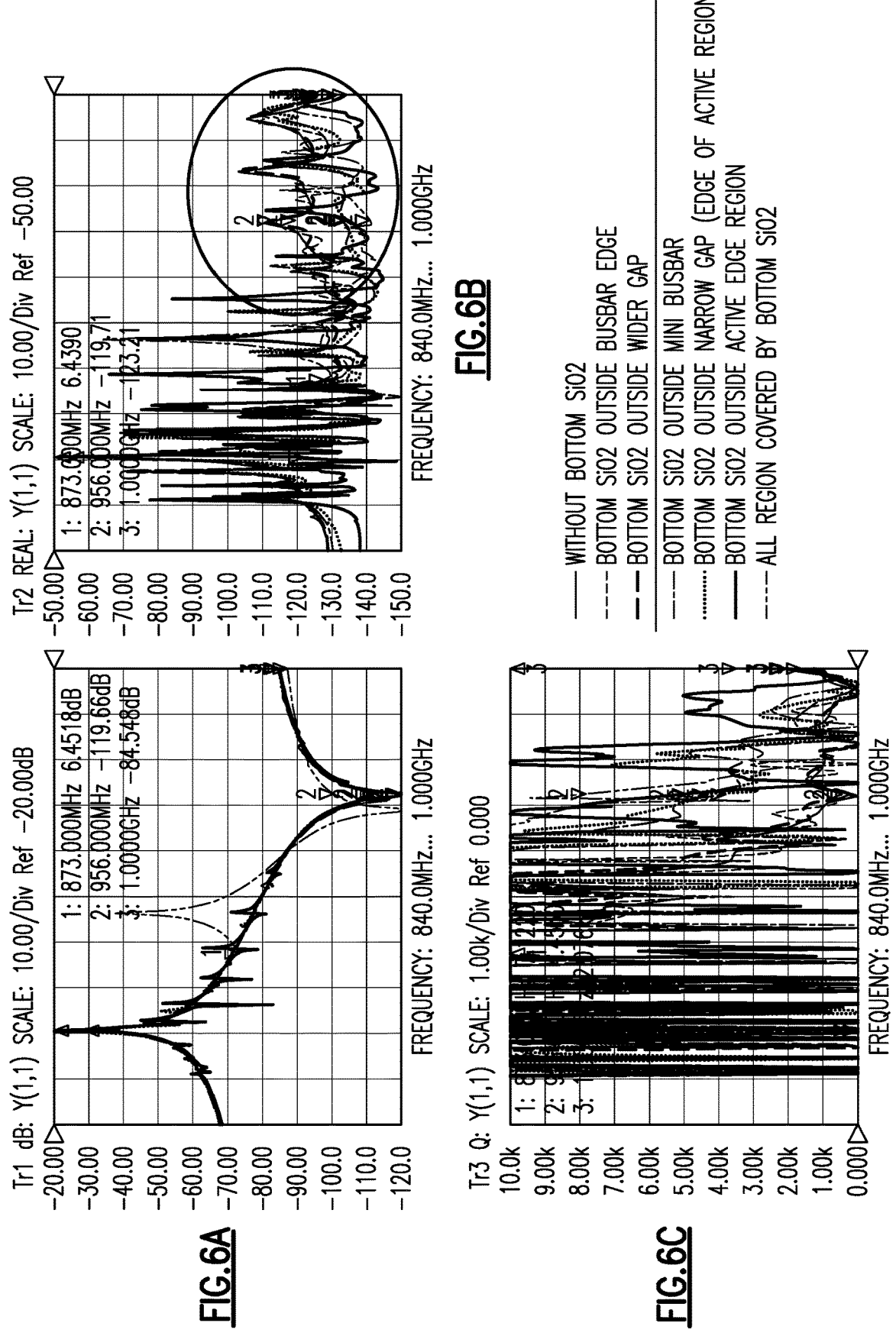
FIGS. 6D-6F are graphs showing simulated frequency responses of various surface acoustic wave devices.

FIGS. 6A-6C are graphs showing simulated frequency responses of surface acoustic wave devices. In a first simulation, the surface acoustic wave device 1 of FIGS. 1A and 1B is used. In a second simulation, the surface acoustic wave device 4 that includes the intermediate dielectric layer 36 positioned under the bus bar 40a, 40b is used. In a third simulation, the surface acoustic wave device 4 that includes the intermediate dielectric layer 36 positioned under the bus bar 40a, 40b and the second sub-gap region 58 is used. In a fourth simulation, the surface acoustic wave device 4 that includes the intermediate dielectric layer 36 positioned under the bus bar 40a, 40b, the second sub-gap region 58, and the mini bus bar 54 is used. In a fifth simulation, the surface acoustic wave device 4 that includes the intermediate dielectric layer 36 positioned under the bus bar 40a, 40b, the second sub-gap region 58, the mini bus bar 54, and the first sub-gap region 56 is used. In a sixth simulation, the surface acoustic wave device 4 that includes the intermediate dielectric layer 36 positioned under the bus bar 40a, 40b, the second sub-gap region 58, the mini bus bar 54, the first sub-gap region 56, and the edge region 48 is used. In a seventh simulation, the surface acoustic wave device 2 of FIGS. 2A and 2B is used.

FIG. 6A shows that a coupling factor $K^2$ in the simulation result of the seventh simulation is significantly smaller than that of the first simulation, while the coupling factors of second to sixth simulations are maintained relatively high as compared to that of the first simulation. FIG. 6B shows that there is a higher transverse leakage of the acoustic energy in the first to third simulations than the fourth to seventh simulations. In other words, the transverse leakage is suppressed in the fourth to seventh simulations. FIG. 6C shows that the quality factor in the first to third simulation results are lower than the fourth to seventh simulation results. The improvement in the quality factor can be due to the suppression of the transverse leakage. From these simulation results, it can be observed that positioning the intermediate dielectric layer 36 under the mini bus bar 54, the first sub-gap region 56, and the edge region 48 may provide sufficient suppression of transverse leakage of acoustic energy, in some applications.

A surface acoustic wave device with a selectively positioned intermediate dielectric layer can enable the surface acoustic wave device to maintain a relatively high coupling factor K2, as well as, to obtain a relatively high quality factor (Q). The benefit of the selectively positioned intermediate dielectric layer can be pronounced when the surface acoustic wave device is configured for a shear horizontal surface acoustic wave device. The surface acoustic wave device with selectively positioned intermediate dielectric layer can improve performance further by, for example, including a piston mode structure for transverse mode suppression.

Figures 6D, 6E, 6F:
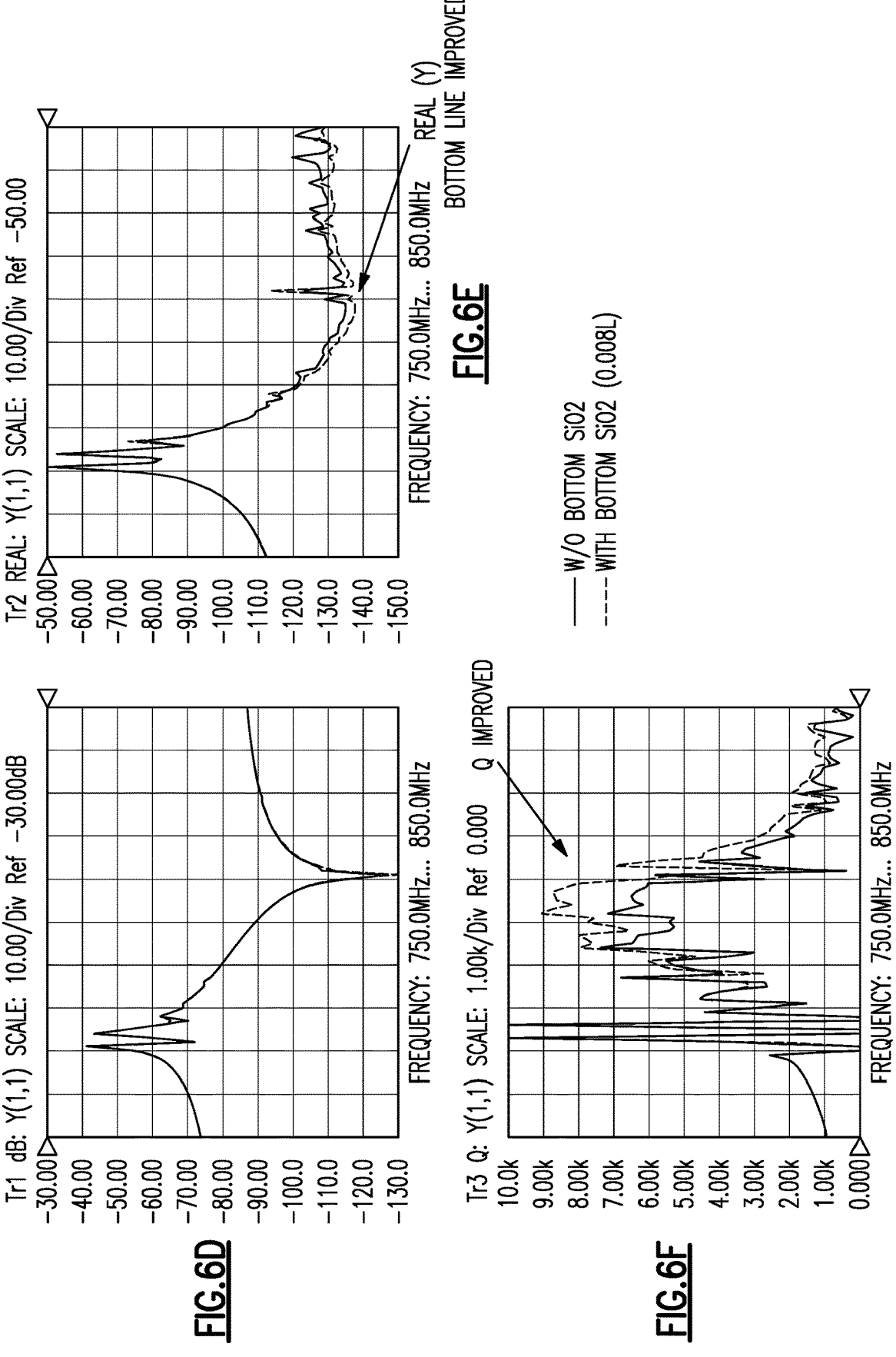

FIGS. 6D-6F are graphs showing simulated frequency responses of surface acoustic wave devices. In a first simulation, a surface acoustic wave device similar to the surface acoustic wave device 1 was used. Unlike the surface acoustic wave device 1, the surface acoustic wave device used in the first simulation includes a lithium niobate layer having a 118° rotated Y-cut, X-propagating (118° YX) cut angle as its piezoelectric layer. The acoustic wave device used in the first simulation also has a multilayer interdigital transducer electrode that includes an aluminum top layer with a thickness of 0.04L, and a tungsten bottom layer with a thickness of 0.08L. In a second simulation, a surface acoustic wave device similar to the surface acoustic wave device 4 is used. The surface acoustic wave device used in the second simulation includes a lithium niobate layer having a 118° rotated Y-cut, X-propagating (118° YX) cut angle as its piezoelectric layer. The acoustic wave device used in the second simulation also has a multilayer interdigital transducer electrode that includes an aluminum top layer with a thickness of 0.04L, and a tungsten bottom layer with a thickness of 0.08L. The acoustic wave device used in the second simulation also has a silicon dioxide layer with a thickness of 0.3L as its intermediate dielectric layer.

FIG. 6D shows that the coupling factor $K^2$ is maintained relatively high in the second simulation as compared to the first simulation. FIG. 6E shows that the Real (Y) bottom line is improved. FIG. 6F shows that the quality factor Q is improved in the second simulation as compared to the first simulation. The simulation results indicate that the intermediate dielectric layer can improve the quality factor Q of a Rayleigh mode acoustic wave device such as a surface acoustic wave device with a lithium niobate layer having a 118° rotated Y-cut, X-propagating (118° YX) cut angle, which belongs to the 128° LN group, as its piezoelectric layer.

Figures 7A, 7B, 7C:
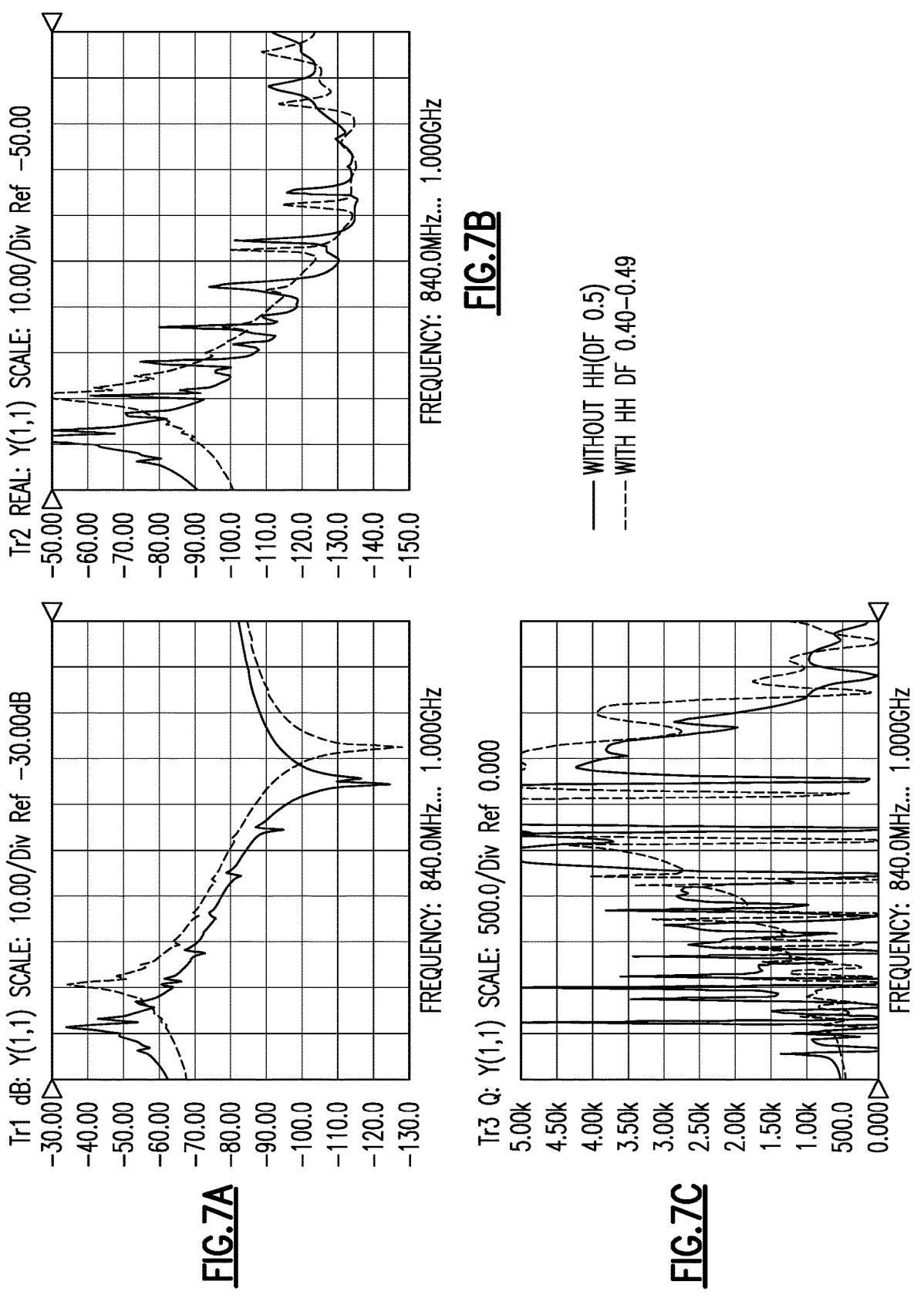
FIGS. 7A-7C are graphs showing simulated frequency responses of surface acoustic wave devices according to various embodiments.

FIGS. 7A-7C are graphs showing simulated frequency responses of surface acoustic wave devices that has a similar structure as the surface acoustic wave device 4 with the intermediate dielectric layer 36 illustrated in FIGS. 5A and 5B. In a first simulation, a surface acoustic wave device without a hammer head structure is used. In a second simulation, a surface acoustic wave device with an interdigital transducer electrode having a hammer head structure is used. The interdigital transducer electrode has a finger that includes a narrower portion with a first duty factor and a wider portion with a second duty factor. A duty factor is calculated by dividing a width by L/2. The first duty factor is calculated by dividing a width of the narrower portion by L/2, and the second duty factor is calculated by dividing a width of the wider portion by L/2. In the second simulation, the first duty factor is set to 0.4, and the second duty factor is set to 0.49. The results show that the hammer head structure can sufficiently suppress the transverse mode.

Figures 8A, 8B, 8C:
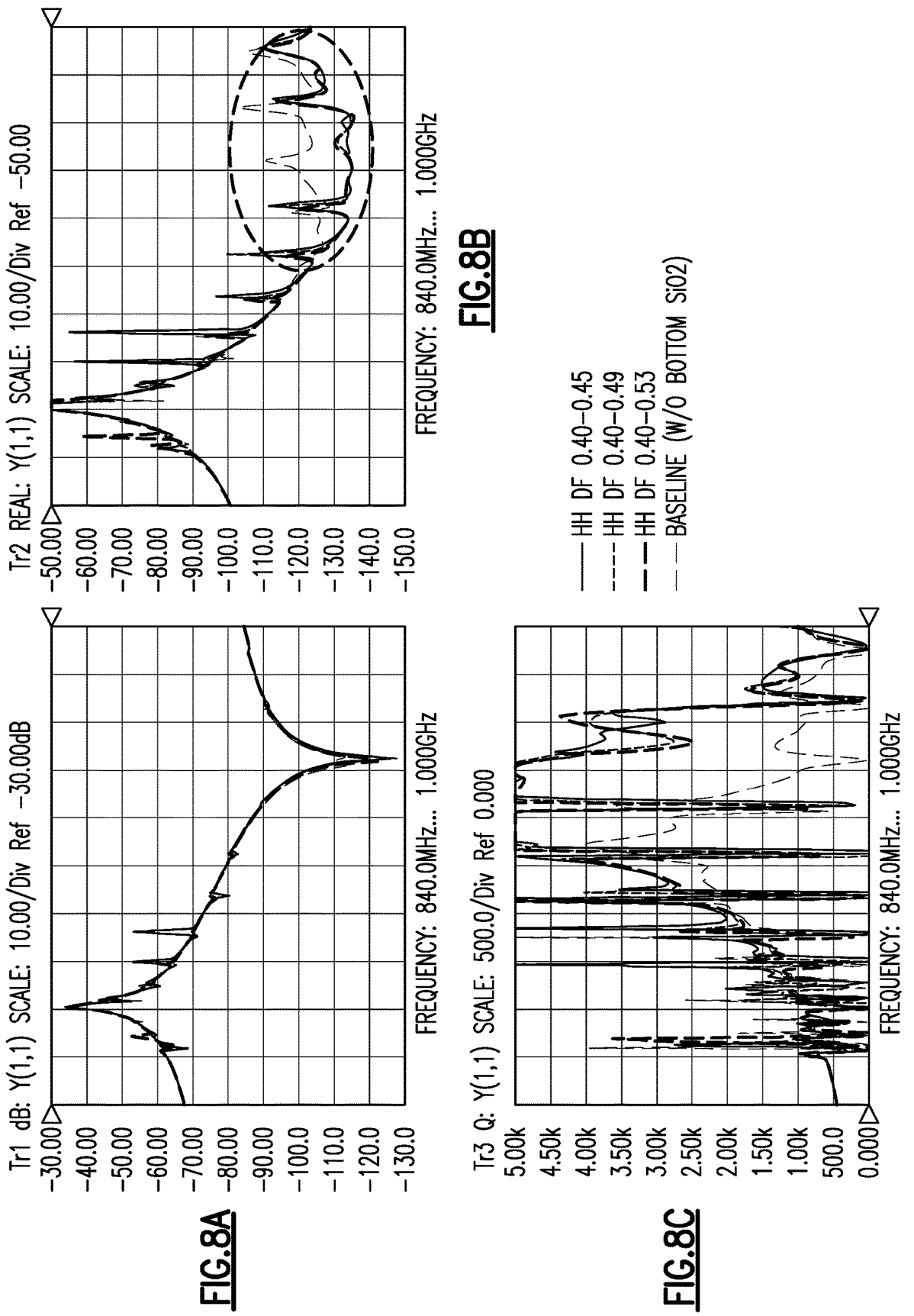
FIGS. 8A-8C are graphs showing simulated frequency responses of various surface acoustic wave devices.

FIGS. 8A-8C are graphs showing simulated frequency responses of surface acoustic wave devices. In first to third simulations, surface acoustic wave devices similar to the surface acoustic wave device 4 of FIGS. 5A and 5B are used. In the first to third simulations, different hammer head sizes are used. In the fourth simulation, a surface acoustic wave device similar to the surface acoustic wave device 1 of FIGS. 1A and 1B. Each of the surface acoustic wave devices used in the first to third simulations include a finger that includes a narrower portion with a first duty factor and a wider portion with a second duty factor. In the first simulation, the first duty factor is set to 0.4, and the second duty factor is set to 0.45. In the second simulation, the first duty factor is set to 0.4, and the second duty factor is set to 0.49. In the third simulation, the first duty factor is set to 0.4, and the second duty factor is set to 0.53. The results show that the transverse acoustic energy leakage is suppressed in the first to third simulations, and the hammer head structure can sufficiently suppress the transverse mode while maintaining the transverse acoustic energy leakage suppression.

Figures 9A, 9B, 9C:
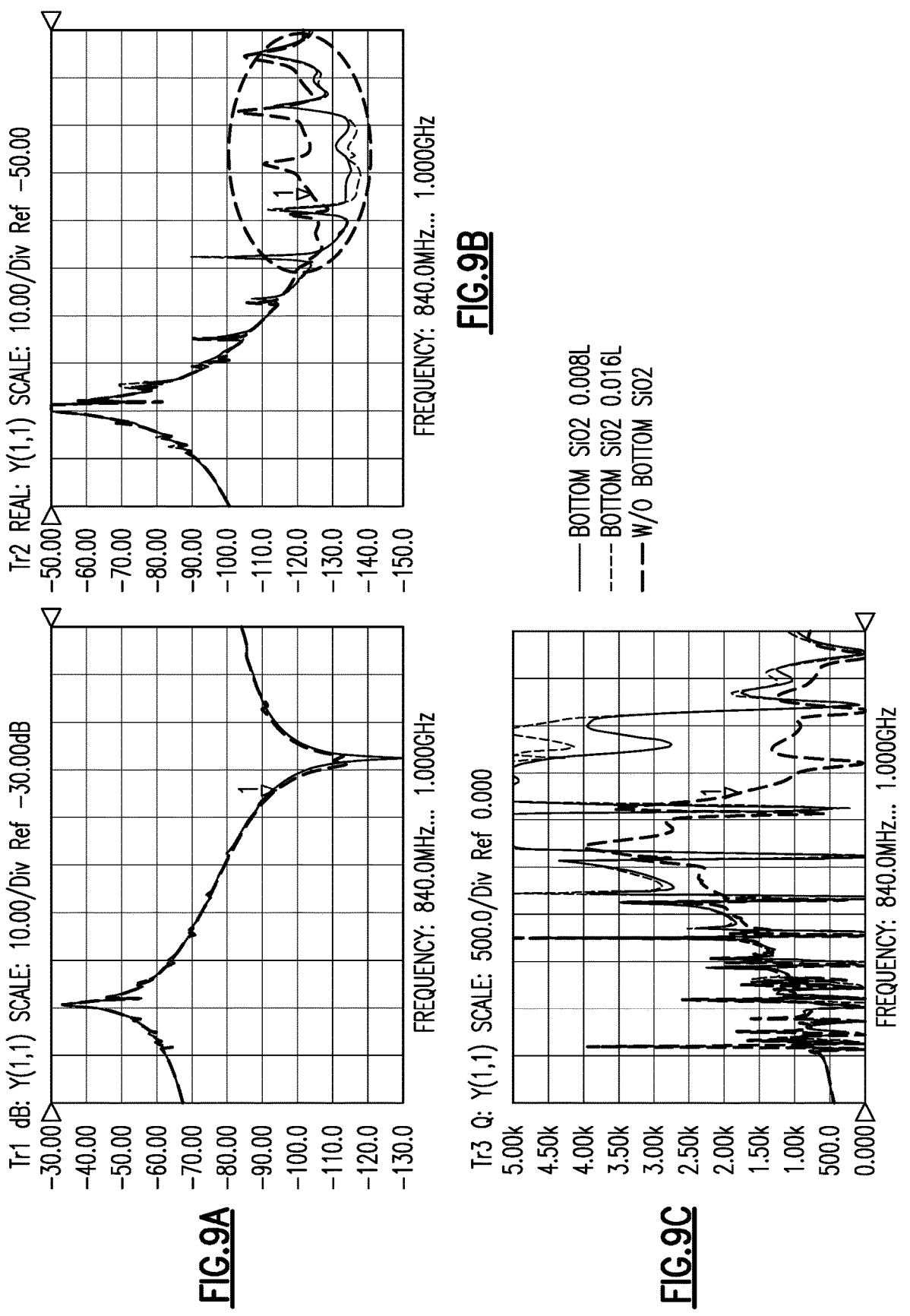
FIGS. 9A-9C are graphs showing simulated frequency responses of various surface acoustic wave devices.

FIGS. 9A-9C are graphs showing simulated frequency responses of surface acoustic wave devices. In a first simulation, the surface acoustic wave device 4 of FIGS. 5A and 5B with the thickness T3 of the intermediate dielectric layer 36 being 0.008L is used where the intermediate dielectric layer 36 is a SiO₂ layer. In a second simulation, the surface acoustic wave device 4 of FIGS. 5A and 5B with the thickness T3 of the intermediate dielectric layer 36 being 0.016L is used where the intermediate dielectric layer 36 is a SiO₂ layer. In a third simulation, the acoustic wave device 1 of FIGS. 1A and 1B is used. The simulation results show that both the thicknesses of T3=0.008L and 0.016L can suppress transverse leakage of acoustic energy.

Figures 10A, 10B:
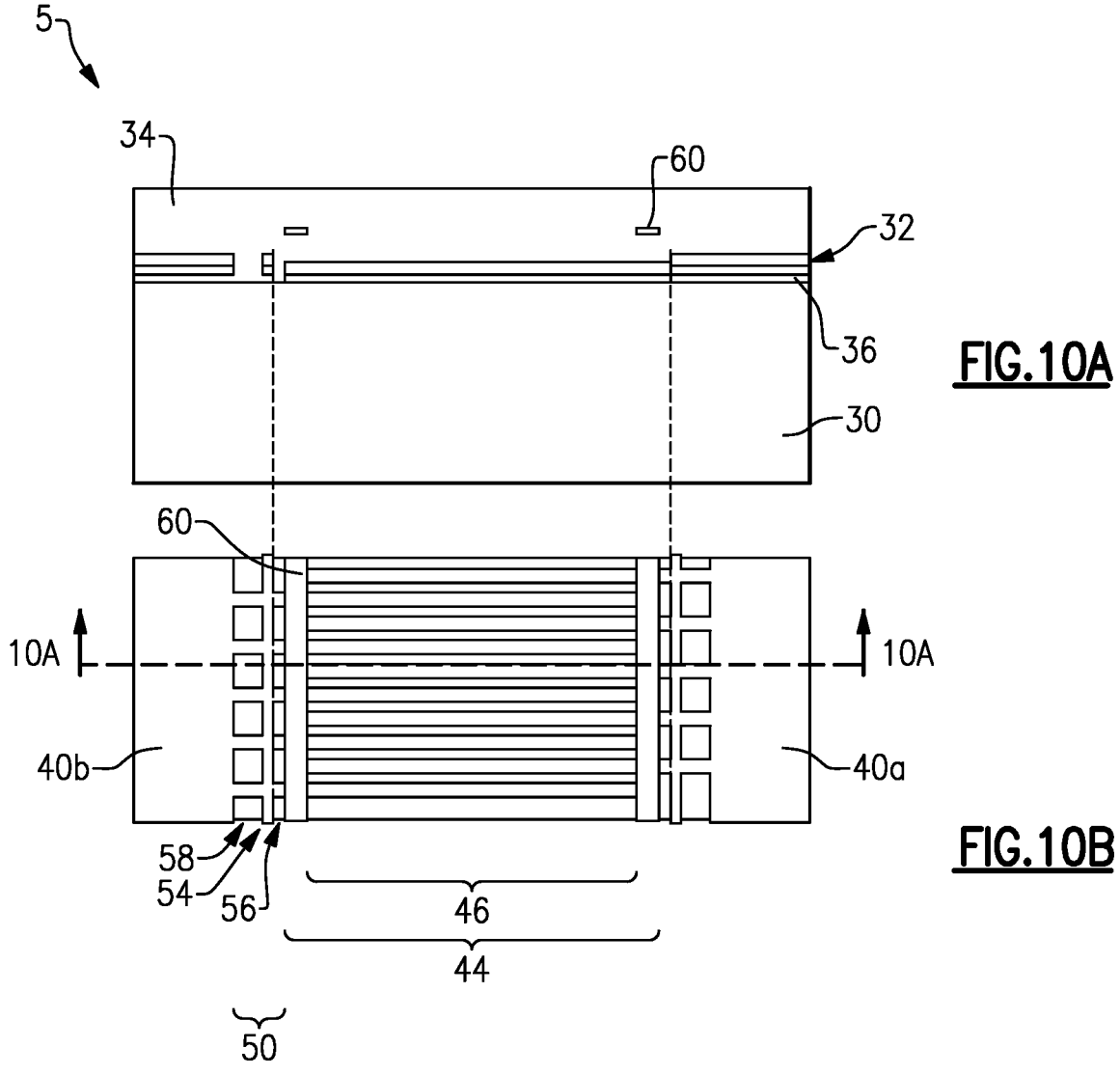
FIG. 10A is a schematic cross sectional side view of a surface acoustic wave device according to an embodiment.
FIG. 10B is a schematic top plan view of the surface acoustic wave device of FIG. 10A.

FIG. 10A is a schematic cross sectional side view of a surface acoustic wave device 5 according to an embodiment. FIG. 10B is a schematic top plan view of the surface acoustic wave device 5. Unless otherwise noted, the components of FIGS. 10A and 10B may be similar to or the same as like numbered components disclosed herein, such as those of FIGS. 5A and 5B.

The surface acoustic wave device 5 can be generally similar to the surface acoustic wave device 4 illustrated in FIGS. 5A and 5B except in the surface acoustic wave device 5, a mass loading strip (e.g., a metal strip 60) embedded in the temperature compensation layer 34 is included. The metal strip 60 can be positioned over the edge region 48 of the interdigital transducer electrode 32. The metal strip 60 can include a high density metal strip layer. The metal strip 60 can be a multi-layer conductive strip in certain embodiments. The metal strip 60 can implement piston mode. Accordingly, the metal strip is an example piston mode structure. The illustrated metal strip 60 is floating. However, in some embodiments, the metal strip 60 can be grounded.

The metal strip 60 performs a mass loading function. Accordingly, the metal strip 60 is an example of a mass loading strip. In certain applications, a mass loading strip of any suitable non-metal and/or non-conductive material that has a density that is equal to or greater than a density of a most dense layer of the interdigital transducer electrode 32 can be implemented in place of the metal strip 60 and/or any metal strip disclosed herein. Such a non-conductive layer can be a heavy dielectric layer such as tantalum pentoxide (Ta₂O₅), tellurium dioxide (TeO₂), or a like dielectric material.

Figures 10C, 10D, 10E:
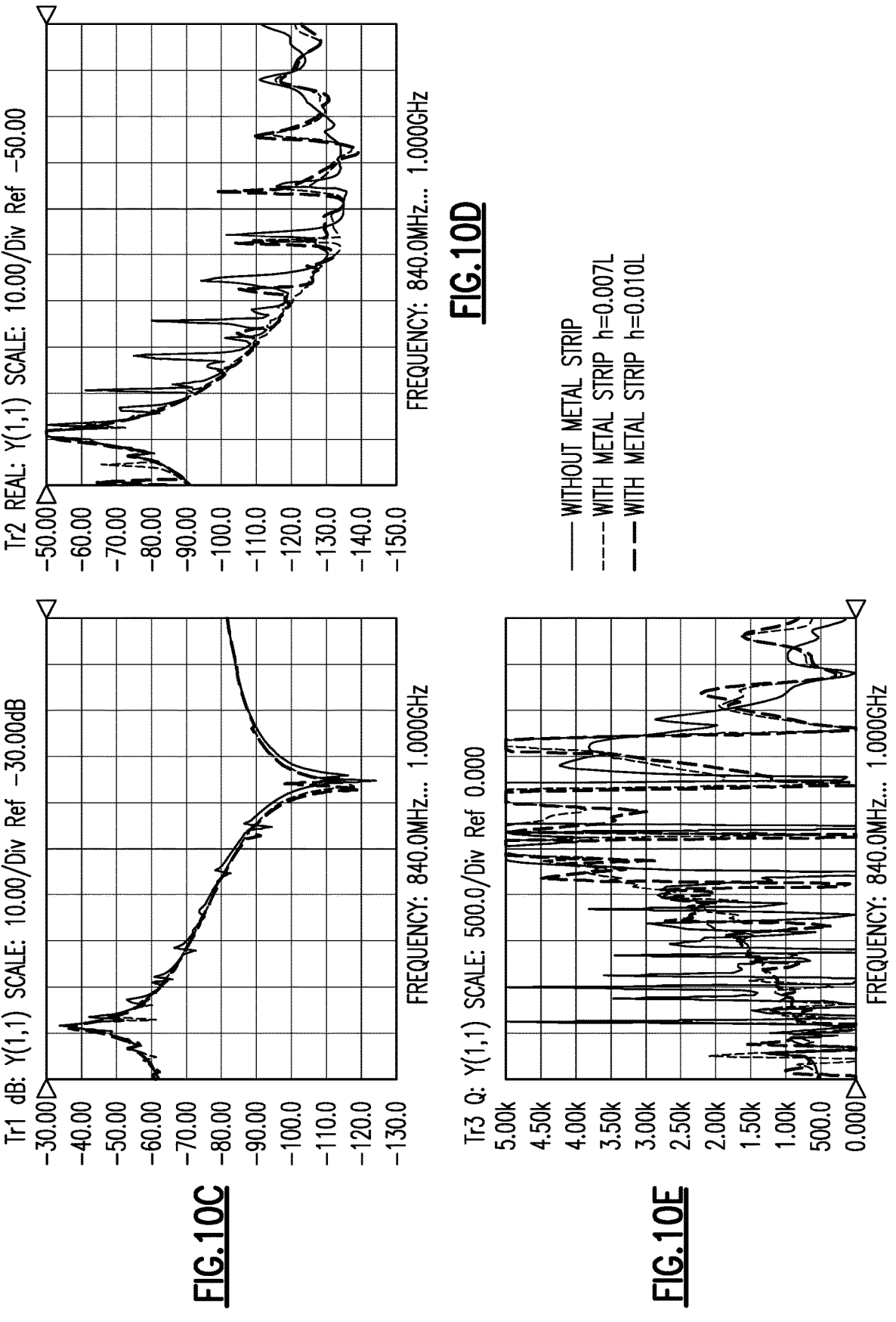
FIGS. 10C-10E are graphs showing simulated frequency responses of various surface acoustic wave devices.

FIGS. 10C-10E are graphs showing simulated frequency responses of surface acoustic wave devices. In a first simulation, the surface acoustic wave device 4 of FIGS. 5A and 5B is used. In a second simulation, the surface acoustic wave device 5 of FIGS. 10A and 10B is used. In the second simulation, a platinum metal strip is used as the metal strip 60, and a thickness of the metal strip 60 is set to 0.007L. In a third simulation, the surface acoustic wave device 5 of FIGS. 10A and 10B is used. In the third simulation, a platinum metal strip is used as the metal strip 60, and the thickness of the metal strip 60 is set to 0.01L. The simulation results show that the metal strip 60 with both the thickness of 0.007L and 0.01L can suppress the transverse mode. The simulation results indicate that a metal strip can contribute to suppressing the transverse mode. Additional descriptions of a mass loading strip may be found throughout U.S. Pub. No. 2022/0209738, the entire content of which is incorporated by reference herein in its entirety and for all purposes.

Figures 11A, 11B:
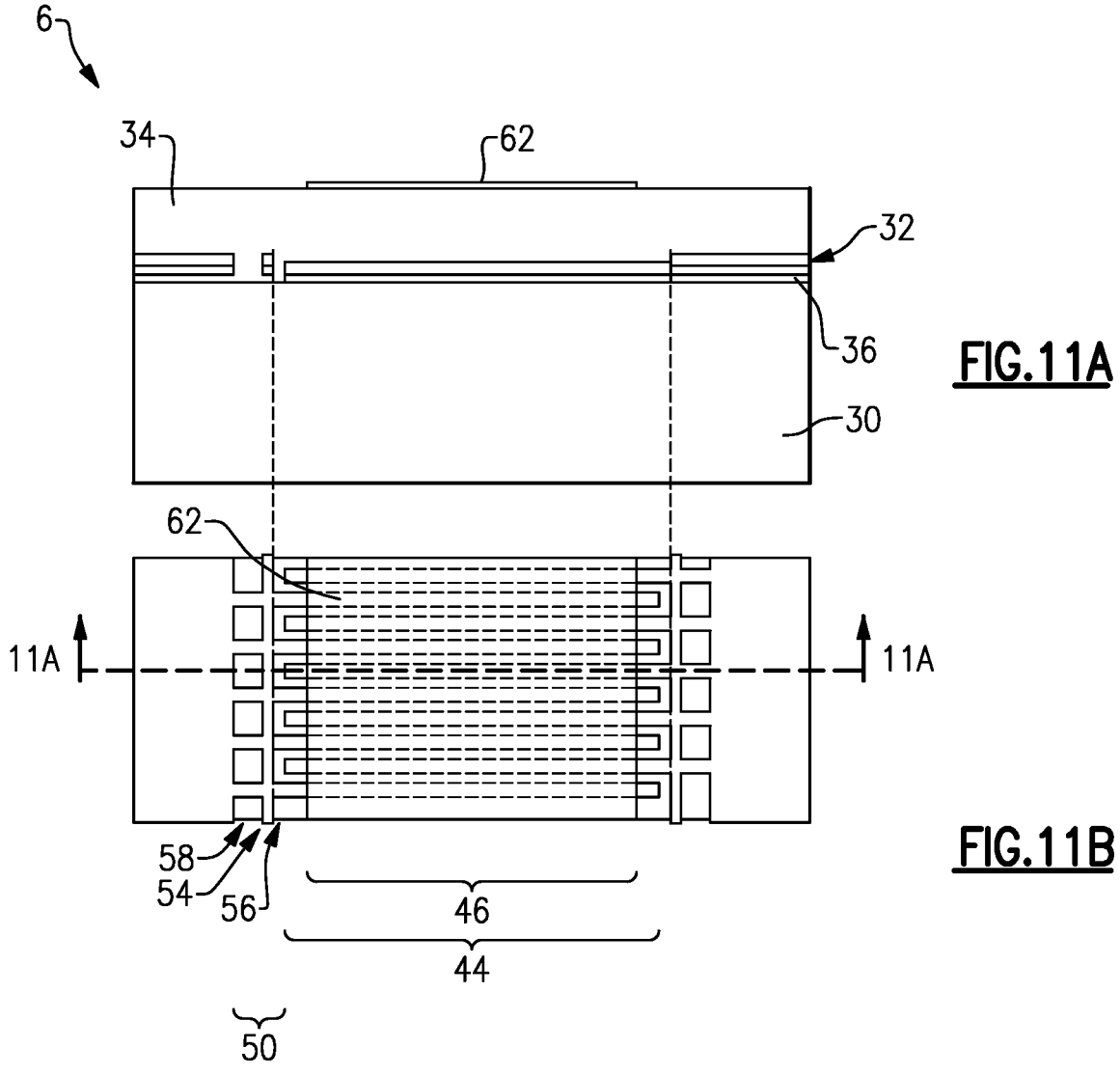
FIG. 11A is a schematic cross sectional side view of a surface acoustic wave device according to an embodiment.
FIG. 11B is a schematic top plan view of the surface acoustic wave device of FIG. 11A FIGS. 11C-11E are graphs showing simulated frequency responses of various surface acoustic wave devices.

FIG. 11A is a schematic cross sectional side view of a surface acoustic wave device 6 according to an embodiment. FIG. 11B is a schematic top plan view of the surface acoustic wave device 6. Unless otherwise noted, the components of FIGS. 11A and 11B may be similar to or the same as like numbered components disclosed herein, such as those of FIGS. 5A and 5B.

The surface acoustic wave device 6 can be generally similar to the surface acoustic wave device 4 illustrated in FIGS. 5A and 5B except in the surface acoustic wave device 6, a dispersion adjustment layer 62 is provided over the temperature compensation layer 34. The dispersion adjustment layer 62 can be positioned over the center region 46 of the interdigital transducer electrode 32. However, the dispersion adjustment layer 62 can be disposed entirely over the upper surface of the temperature compensation layer 34 in some other instances. The dispersion adjustment layer 62 can cause a magnitude of the velocity in the underlying region of the surface acoustic wave device 6 to be increased. The portions uncovered by the dispersion adjustment layer 62 can reduce velocity in the underlying region of the surface acoustic wave device 6 relative to regions covered by the dispersion adjustment layer 6 to thereby suppress transverse modes. The dispersion adjustment layer 62 can include a SiN layer. In certain applications, the dispersion adjustment layer 62 can include any suitable material to increase the magnitude of the velocity of the underlying region of a surface acoustic wave device 6. According to some applications, the dispersion adjustment layer 62 can include SiN and another material. The dispersion adjustment layer 62 can have a thickness in a range from 0.001L to 0.05L.

FIGS. 11C-11E are graphs showing simulated frequency responses of surface acoustic wave devices. In a first simulation, the surface acoustic wave device 4 of FIGS. 5A and 5B is used. In a second simulation, the surface acoustic wave device 6 of FIGS. 11A and 11B is used. In the second simulation, a thickness of the dispersion adjustment layer 62 is set to 0.01L. The piezoelectric layer used in the first and second simulations are a lithium niobate (LN) layer with a rotated Y-cut, X-propagating cut angle of 0°. The simulation results show that the dispersion adjustment layer 62 with the thickness of 0.01L can suppress the transverse mode.

FIGS. 11C-11E are graphs showing simulated frequency responses of surface acoustic wave devices. In a first simulation, a surface acoustic wave device similar to the surface acoustic wave device 1 was used. Unlike the surface acoustic wave device 1, the surface acoustic wave device used in the first simulation includes a lithium niobate layer having a 126.2° rotated Y-cut, X-propagating (126.2° YX) cut angle as its piezoelectric layer. Also, unlike the surface acoustic wave device 1, an interdigital transducer electrode of the surface acoustic wave device used in the first simulation does not have a hammerhead shape. The acoustic wave device used in the first simulation also has a multilayer interdigital transducer electrode that includes an aluminum top layer with a thickness of 0.04L, and a tungsten bottom layer with a thickness of 0.04L. In a second simulation, the surface acoustic wave device 6 of FIGS. 11A and 11B is used. The surface acoustic wave device used in the second simulation includes a lithium niobate layer having a 126.2° rotated Y-cut, X-propagating (126.2° YX) cut angle as its piezoelectric layer. The acoustic wave device used in the first simulation also has a multilayer interdigital transducer electrode that includes an aluminum top layer with a thickness of 0.04L, and a tungsten bottom layer with a thickness of 0.04L. In the second simulation, a thickness of the dispersion adjustment layer 62 is set to 0.0005L. The simulation results indicate that the intermediate dielectric layer can improve the quality factor Q of a Rayleigh mode acoustic wave device such as a surface acoustic wave device with a lithium niobate layer having a 126.2° rotated Y-cut, X-propagating (126.2° YX) cut angle, which belongs to the 128° LN group, as its piezoelectric layer.

Figures 11I, 11J, 11K:
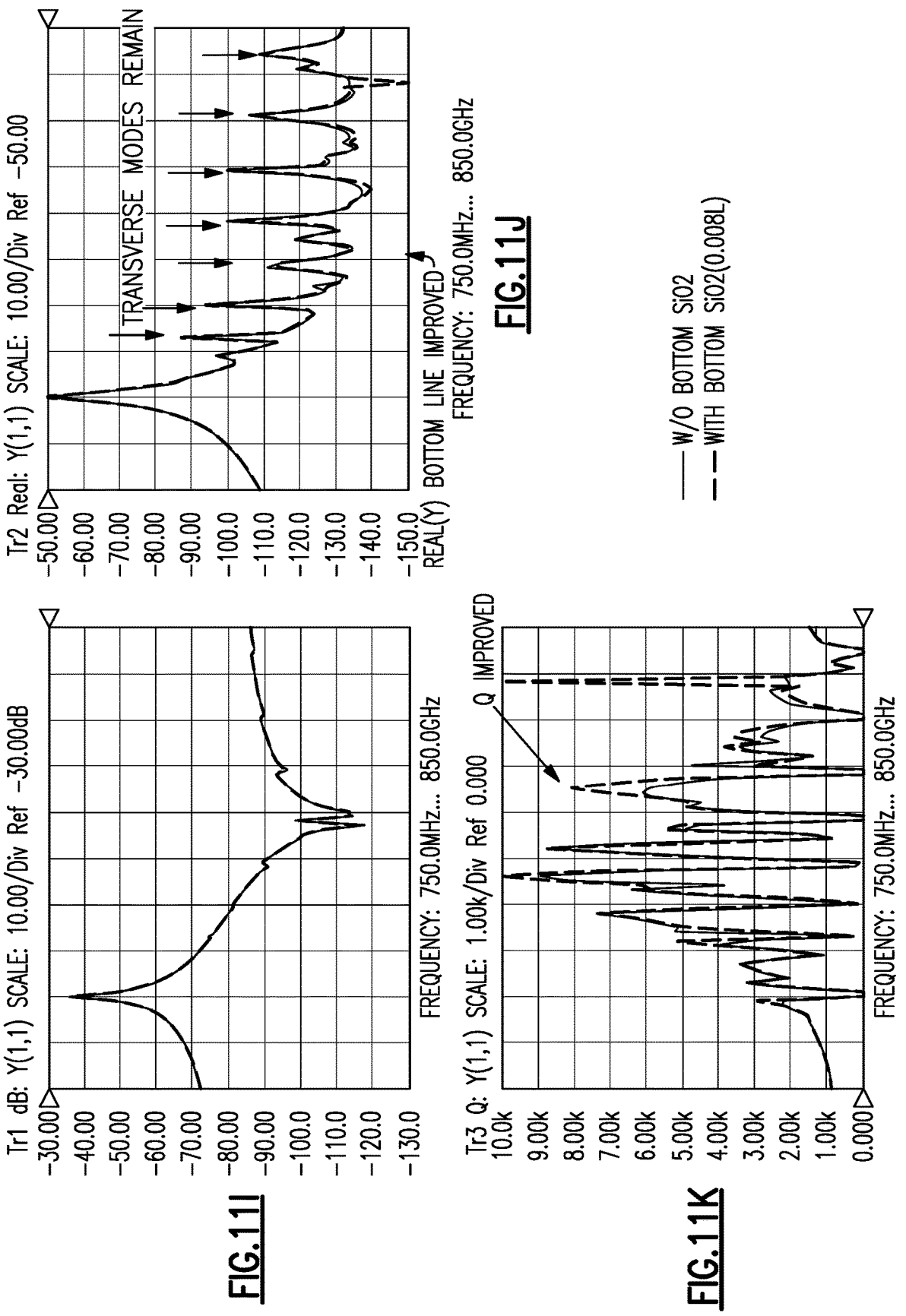
FIGS. 11I-11K are graphs showing simulated frequency responses of various surface acoustic wave devices.

FIGS. 11I-11K are graphs showing simulated frequency responses of surface acoustic wave devices. In a first simulation, a surface acoustic wave device similar to the surface acoustic wave device 1 was used. Unlike the surface acoustic wave device 1, the surface acoustic wave device used in the first simulation includes a lithium niobate layer having a 118° rotated Y-cut, X-propagating (118° YX) cut angle as its piezoelectric layer. Also, unlike the surface acoustic wave device 1, an interdigital transducer electrode of the surface acoustic wave device used in the first simulation does not have a hammerhead shape. The acoustic wave device used in the first simulation also has a multilayer interdigital transducer electrode that includes an aluminum top layer with a thickness of 0.04L, and a tungsten bottom layer with a thickness of 0.08L. In a second simulation, the surface acoustic wave device 6 of FIGS. 11A and 11B is used. The surface acoustic wave device used in the second simulation includes a lithium niobate layer having a 118° rotated Y-cut, X-propagating (118° YX) cut angle as its piezoelectric layer. The acoustic wave device used in the first simulation also has a multilayer interdigital transducer electrode that includes an aluminum top layer with a thickness of 0.04L, and a tungsten bottom layer with a thickness of 0.08L. In the second simulation, a thickness of the dispersion adjustment layer 62 is set to 0.0007L. The simulation results indicate that the intermediate dielectric layer can improve the quality factor Q of a Rayleigh mode acoustic wave device such as a surface acoustic wave device with a lithium niobate layer having a 118° rotated Y-cut, X-propagating (118° YX) cut angle, which belongs to the 128° LN group, as its piezoelectric layer.

Figures 12A, 12B, 12C:
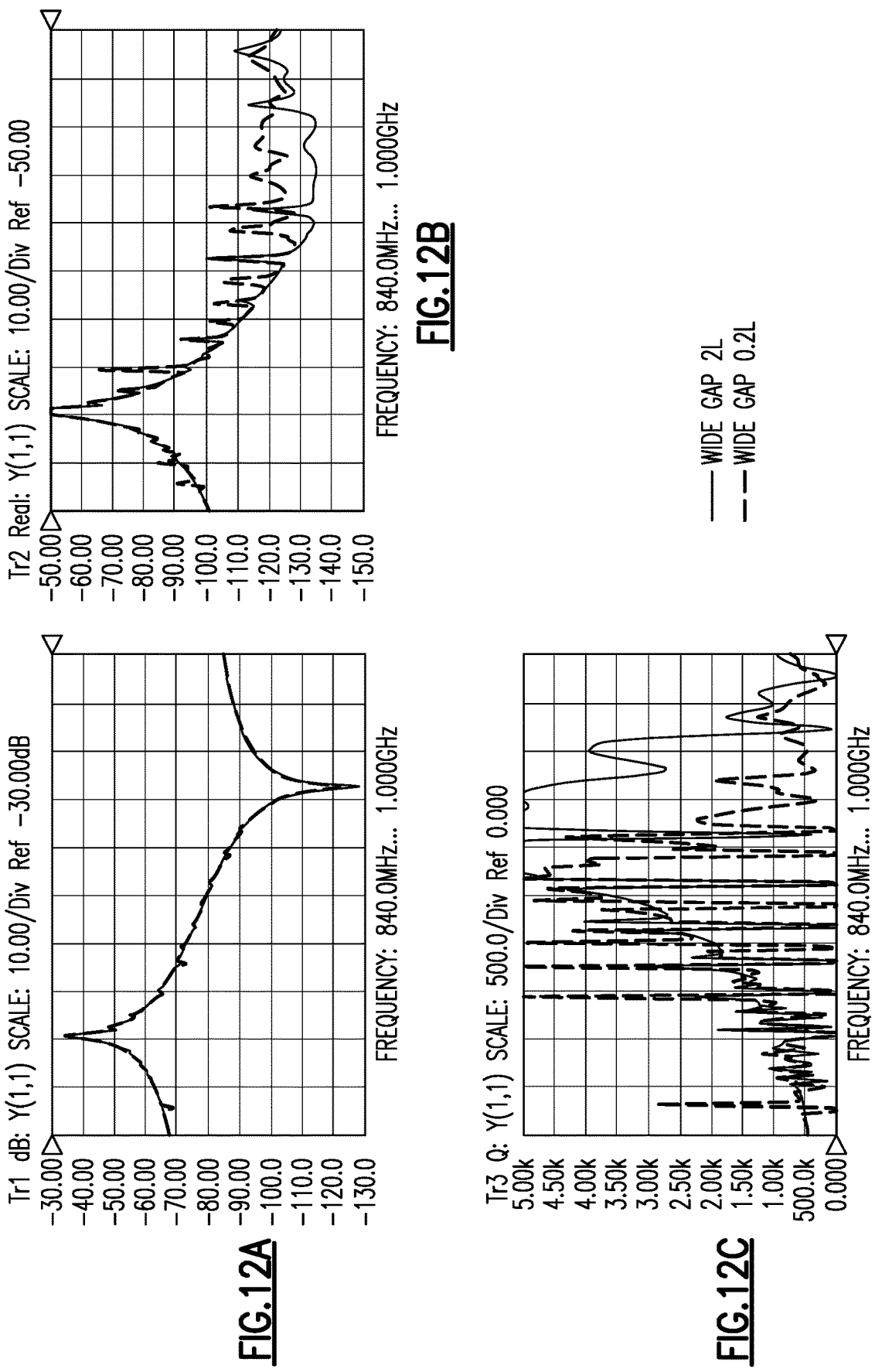
FIGS. 12A-12C are graphs showing simulated frequency responses of surface acoustic wave devices according to various embodiments.

FIGS. 12A-12C are graphs showing simulated frequency responses of surface acoustic wave devices similar to the surface acoustic wave device 4 of FIGS. 5A and 5B. In a first simulation, the second gap 58 between the bus bar 40b and the mini bus bar 54 is set to be 2L wide. In a second simulation, the second gap 58 between the bus bar 40b and the mini bus bar 54 is set to be 0.2L wide. The simulation results show that reduction of the width of the second gap 58 may degrade the quality factor.

Figures 13A, 13B, 13C:
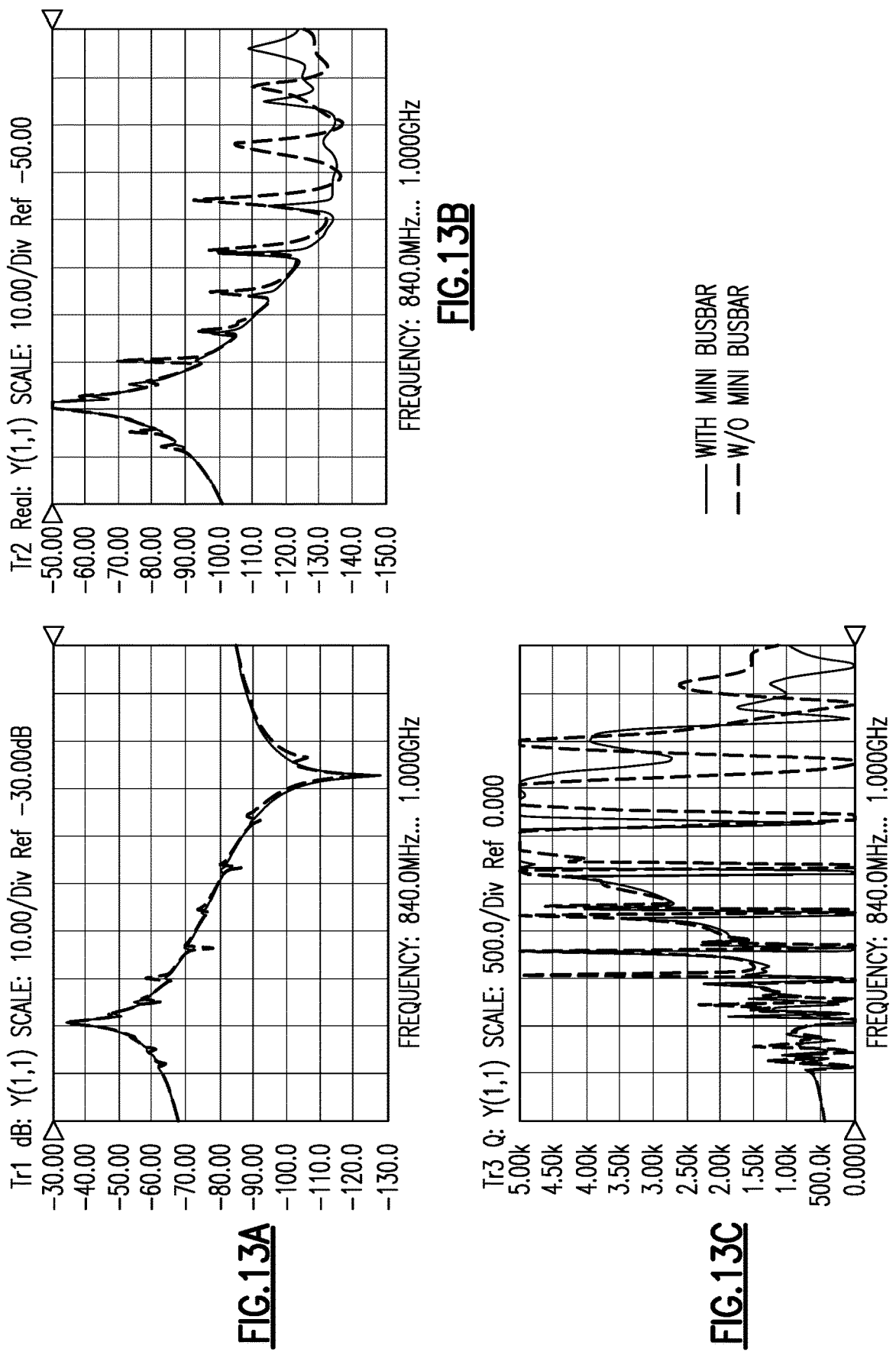
FIGS. 13A-13C are graphs showing simulated frequency responses of surface acoustic wave devices according to various embodiments.

FIGS. 13A-13C are graphs showing simulated frequency responses of surface acoustic wave devices similar to the surface acoustic wave device 4 of FIGS. 5A and 5B. In a first simulation, the surface acoustic wave device 4 with the mini bus bar 40 as illustrated in FIGS. 5A and 5B is used. In a second simulation, the mini bus bar 40 is omitted. The simulation results show that a mini bus bar can suppress a higher order transverse mode.

FIGS. 14A-14C are graphs showing simulated frequency responses of surface acoustic wave devices similar to the surface acoustic wave device 4 of FIGS. 5A and 5B. In a first simulation, platinum is used as the first layer 32a of the interdigital transducer electrode 32 and the thickness T1 of the first layer 32a is set to 0.025L. In a second simulation, platinum is used as the first layer 32a of the interdigital transducer electrode 32 and the thickness T1 of the first layer 32a is set to 0.037L. The simulation results show that a thicker interdigital transducer electrode can generate slower velocity. This may be beneficial for reducing the size of a surface acoustic wave device.

Figures 15A, 15B, 15C:
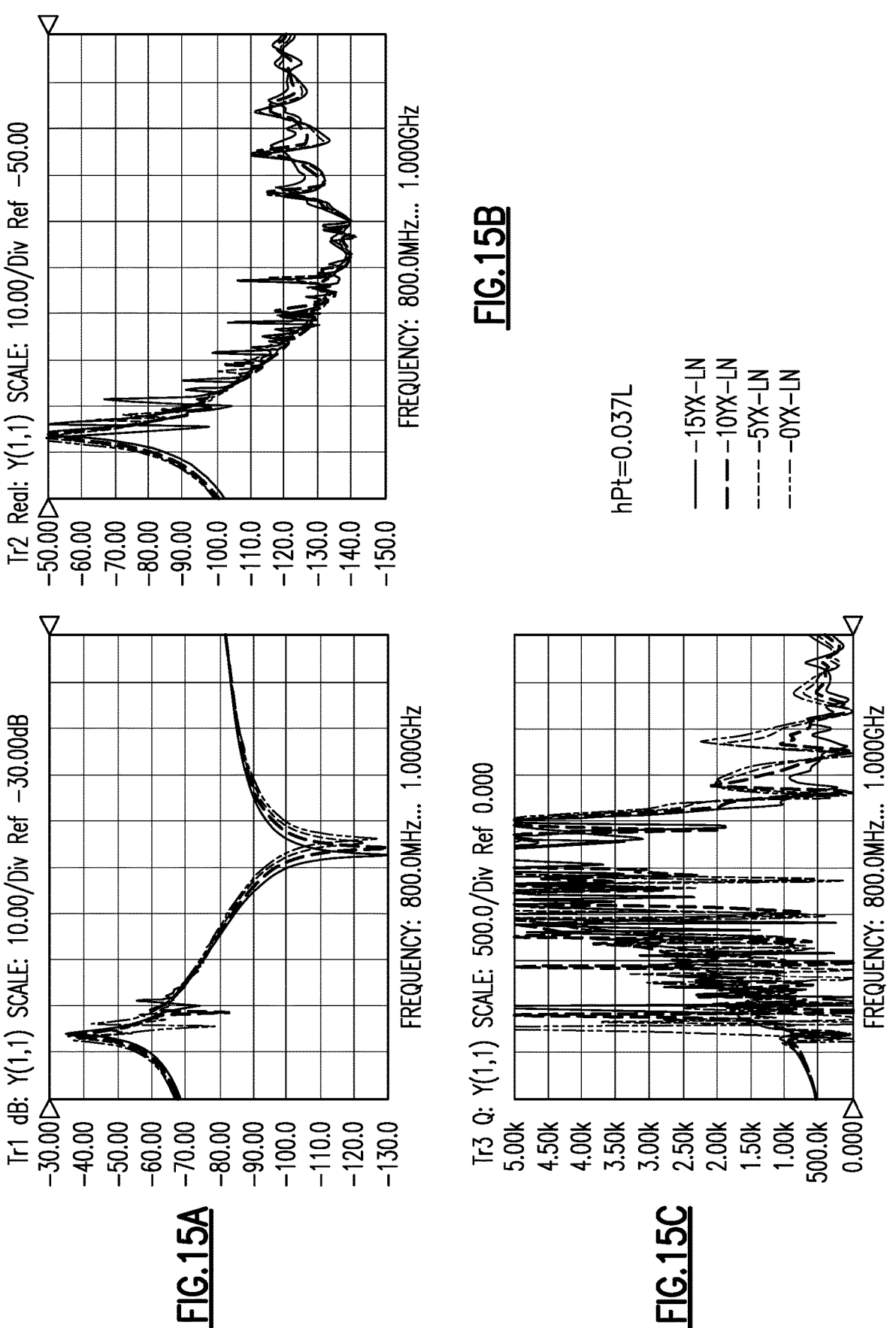
FIGS. 15A-15C are graphs showing simulated frequency responses of surface acoustic wave devices according to various embodiments.

FIGS. 15A-15C are graphs showing simulated frequency responses of surface acoustic wave devices similar to the surface acoustic wave device 4 of FIGS. 5A and 5B. In a first simulation, a lithium niobate layer with a cut angle of −15° is used as the piezoelectric layer 30. In a second simulation, lithium niobate layer with a cut angle of −10° is used as the piezoelectric layer 30. In a third simulation, lithium niobate layer with a cut angle of –5° is used as the piezoelectric layer 30. In a fourth simulation, lithium niobate layer with a cut angle of 0° is used as the piezoelectric layer 30. In these simulations, platinum is used as the first layer 32a of the interdigital transducer electrode 32 and the thickness T1 of the first layer 32a is set to 0.037L. The simulation results show that when a 0.037L thick platinum layer is used as the first layer 32a, a lithium niobate layer with a cut angle in a range from –10° to 0° provides better performance than other cut angles.

Figures 16A, 16B:
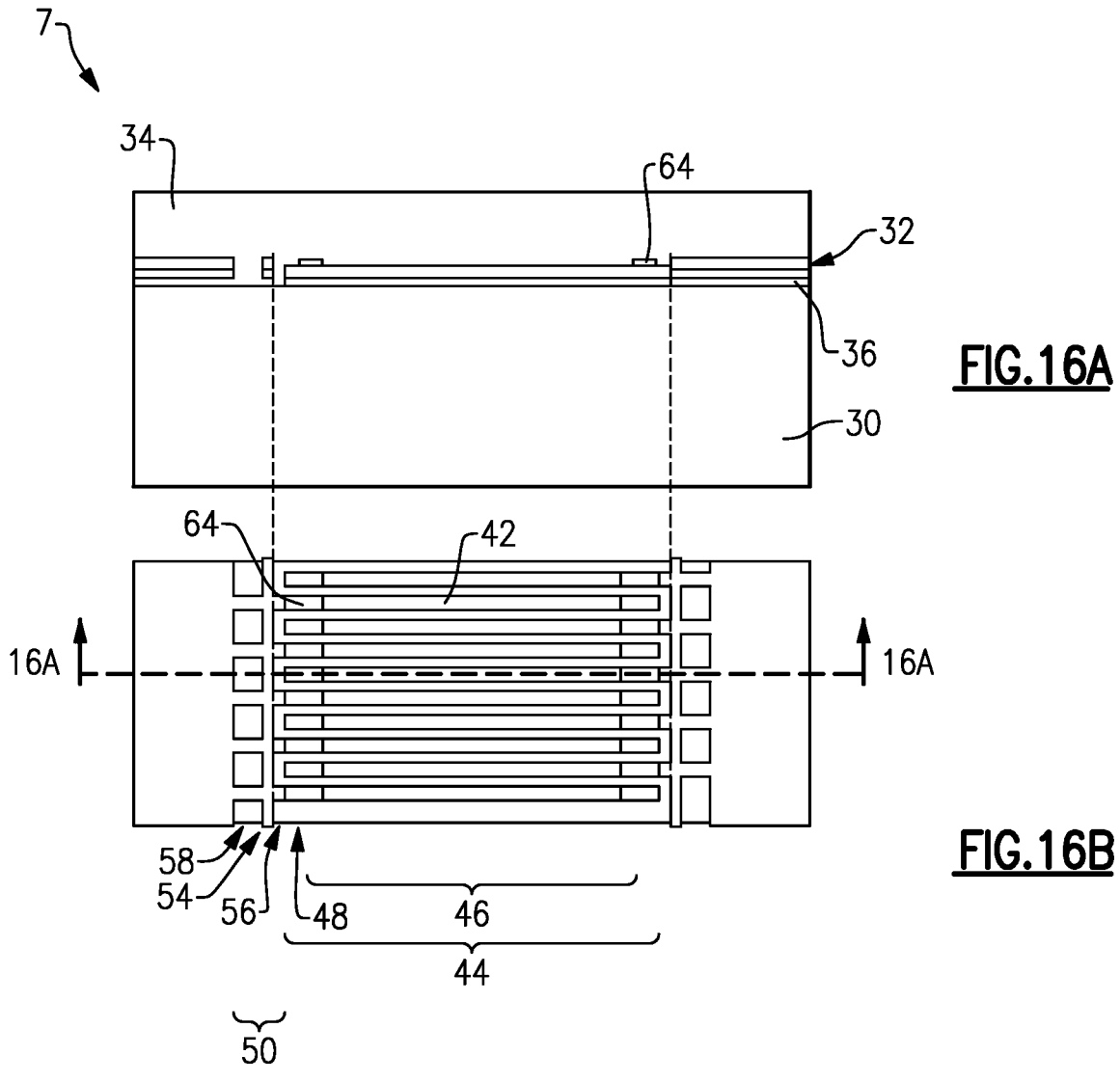
FIG. 16A is a schematic cross sectional side view of a surface acoustic wave device according to an embodiment.
FIG. 16B is a schematic top plan view of the surface acoustic wave device of FIG. 16A.

FIG. 16A is a schematic cross sectional side view of a surface acoustic wave device 7 according to an embodiment. FIG. 16B is a schematic top plan view of the surface acoustic wave device 7. Unless otherwise noted, the components of FIGS. 16A and 16B may be similar to or the same as like numbered components disclosed herein.

The surface acoustic wave device 7 can be generally similar to the surface acoustic wave device 5 illustrated in FIGS. 10A and 10B except in the surface acoustic wave device 7, a mass loading structure 64 is formed on edge regions 48 of the interdigital transducer electrode 32. The mass loading structure 64 can include the same material as the metal strip 60 of the surface acoustic wave device 5.

Figures 16C, 16D, 16E:
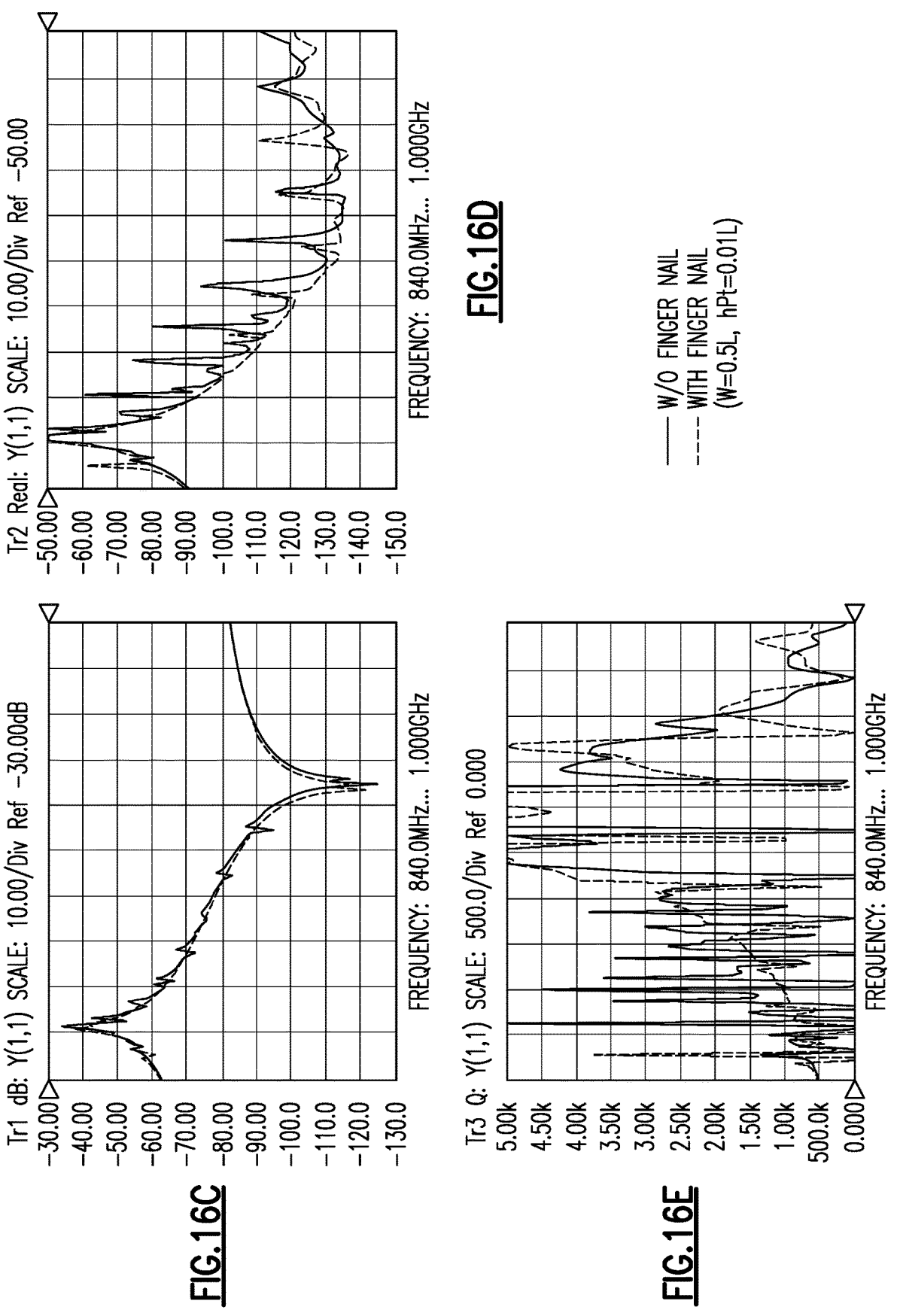
FIGS. 16C-16E are graphs showing simulated frequency responses of various surface acoustic wave devices.

FIGS. 16C-16E are graphs showing simulated frequency responses of surface acoustic wave devices. In a first simulation, the surface acoustic wave device 4 of FIGS. 5A and 5B is used. In a second simulation, the surface acoustic wave device 7 of FIGS. 16A and 16B is used. In the second simulation, a platinum layer is used as the mass loading structure 64. Also, a thickness of the mass loading structure 64 is set to 0.01L, and a length of the mass loading structure 64 along the length of the finger 42 is set to 0.5L. The simulation results show that the mass loading structure 64 can suppress the transverse mode.

Figures 17A, 17B:
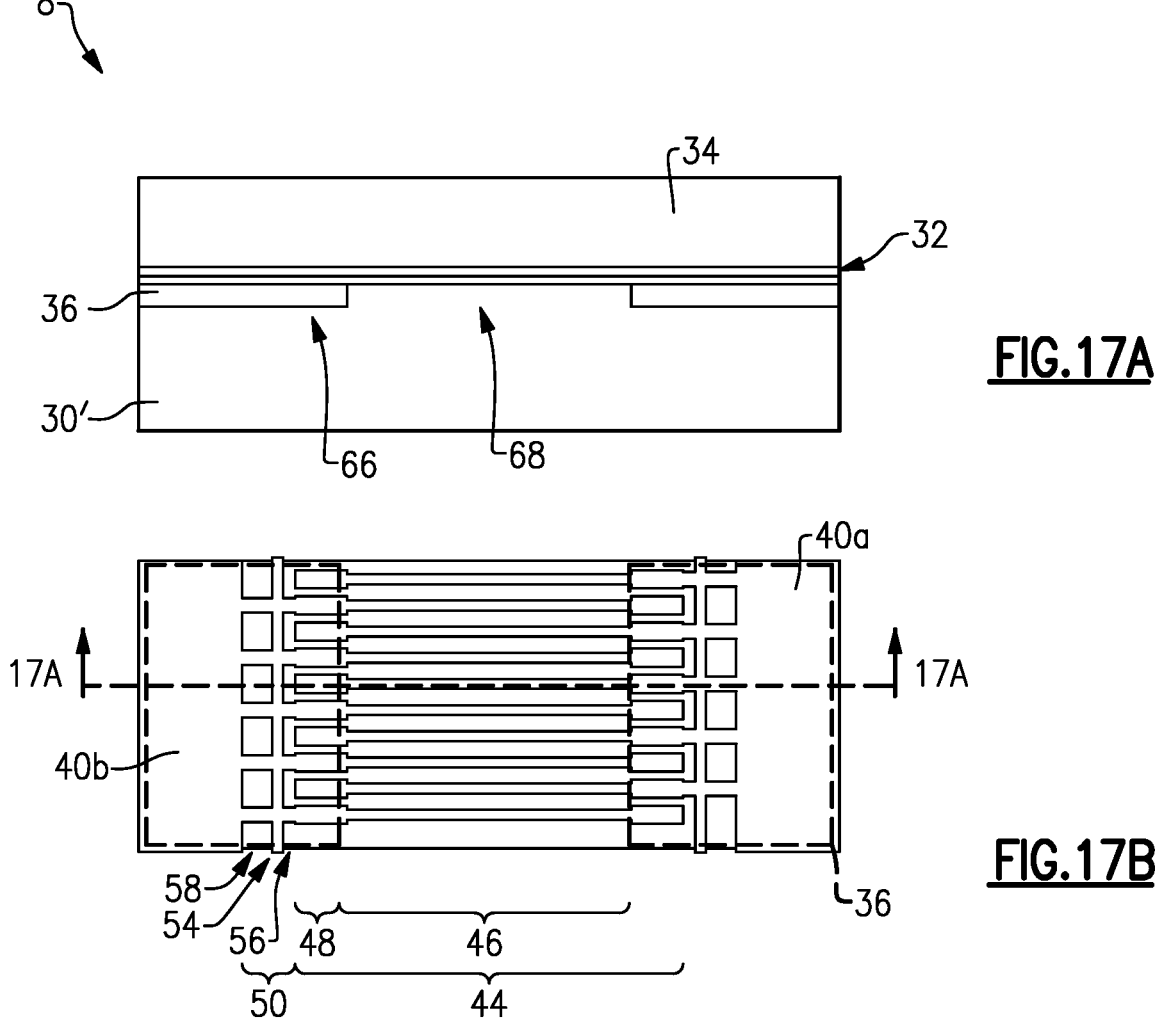
FIG. 17A is a schematic cross sectional side view of a surface acoustic wave device according to an embodiment.
FIG. 17B is a schematic top plan view of the surface acoustic wave device of FIG. 17A.

FIG. 17A is a schematic cross sectional side view of a surface acoustic wave device 8 according to an embodiment. FIG. 17B is a schematic top plan view of the surface acoustic wave device 8. Unless otherwise noted, the components of FIGS. 17A and 17B may be similar to or the same as like numbered components disclosed herein.

The acoustic wave device 8 includes a piezoelectric layer 30', an interdigital transducer electrode 32 over the piezoelectric layer 30', a temperature compensation layer 34 over the interdigital transducer electrode 34, and an intermediate dielectric layer 36 positioned partially between the piezoelectric layer 30' and the interdigital transducer electrode 34.

The interdigital transducer electrode 32 includes a bus bar 40a and a plurality of fingers 42 that extend from the bus bar 40a. The interdigital transducer electrode 32 also includes another bus bar 40b. The interdigital transducer electrode 32 also includes another bus bar 40b. The interdigital transducer electrode 32 includes an active region 44 that has a center region 46 and an edge region 48, and a gap region 50 between the active region 44 and the bus bar 40b. The edge region 48 can be a region near an edge of a finger 42 that is farthest from the bus bar 40a. In some embodiments, the edge region 48 is a region of the finger within 0.5L to 1.2L from the edge of the finger. The interdigital transducer electrode 32 can also include a mini bus bar 54 in the gap region 50. The mini bus bar 54 can be spaced apart from the active region 44 by a first sub-gap region 56, and be spaced apart from the bus bar 40b by a second sub-gap region 58. The mini bus bar 54 can contribute to suppressing a transverse mode.

In some embodiments, portions of the piezoelectric layer 30' under the bus bar 40a, 40b, edge region 48, and the gap region 50 can be etched. The piezoelectric layer 30' can have a recessed portion 66 and a raised portion 68. The piezoelectric layer 30' enable the interdigital transducer electrode 32 to be flat or near flat, when the intermediate dielectric layer 36 is present. Therefore, it can be easier to form the interdigital transducer electrode 32 as compared to forming the interdigital transducer electrode 32 on an uneven surface.

Any suitable principles and advantages disclosed herein can be implemented in a variety of acoustic wave devices. For example, any suitable principles and advantages disclosed herein can be applied to multilayer piezoelectric surface acoustic wave devices, non-temperature compensated surface acoustic wave devices that does not include a temperature compensation layer over an interdigital transducer electrode, Lamb wave resonators, shear horizontal mode acoustic wave device, Rayleigh mode acoustic wave device, or any acoustic wave devices that include an interdigital transducer electrode over a piezoelectric layer.

Figure 18A:
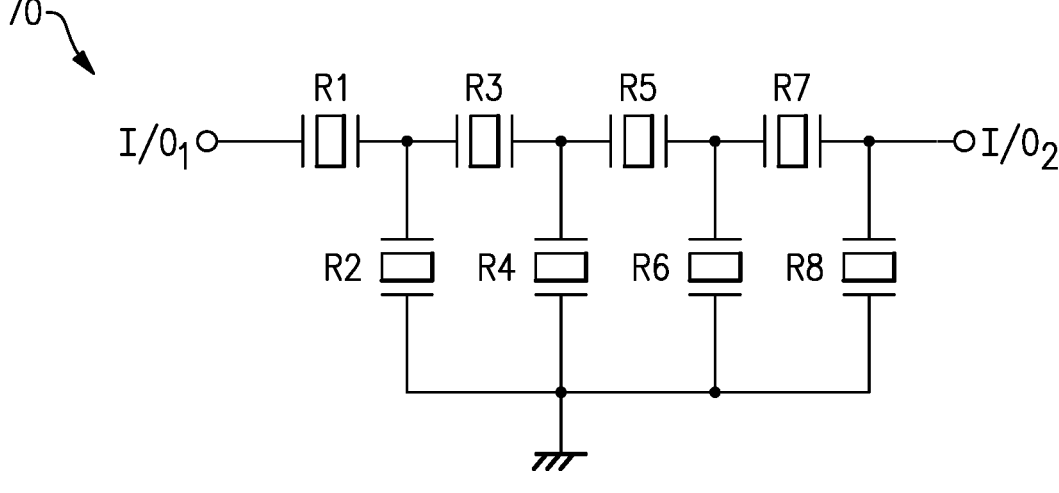
FIG. 18A is a schematic diagram of a ladder filter that includes an acoustic wave resonator according to an embodiment.

FIG. 18A is a schematic diagram of a ladder filter 70 that includes an acoustic wave resonator according to an embodiment. The ladder filter 70 is an example topology that can implement a band pass filter formed from acoustic wave resonators. In a band pass filter with a ladder filter topology, the shunt resonators can have lower resonant frequencies than the series resonators. The ladder filter 70 can be arranged to filter a radio frequency signal. As illustrated, the ladder filter 70 includes series acoustic wave resonators R1, R3, R5, and R7 and shunt acoustic wave resonators R2, R4, R6, and R8 coupled between a first input/output port I/O$_1$ and a second input/output port I/O$_2$. Any suitable number of series acoustic wave resonators can be in included in a ladder filter. Any suitable number of shunt acoustic wave resonators can be included in a ladder filter. The first input/output port I/O$_1$ can a transmit port and the second input/output port I/O$_2$ can be an antenna port. Alternatively, first input/output port I/O$_1$ can be a receive port and the second input/output port I/O$_2$ can be an antenna port.

Figures 18B, 18C:
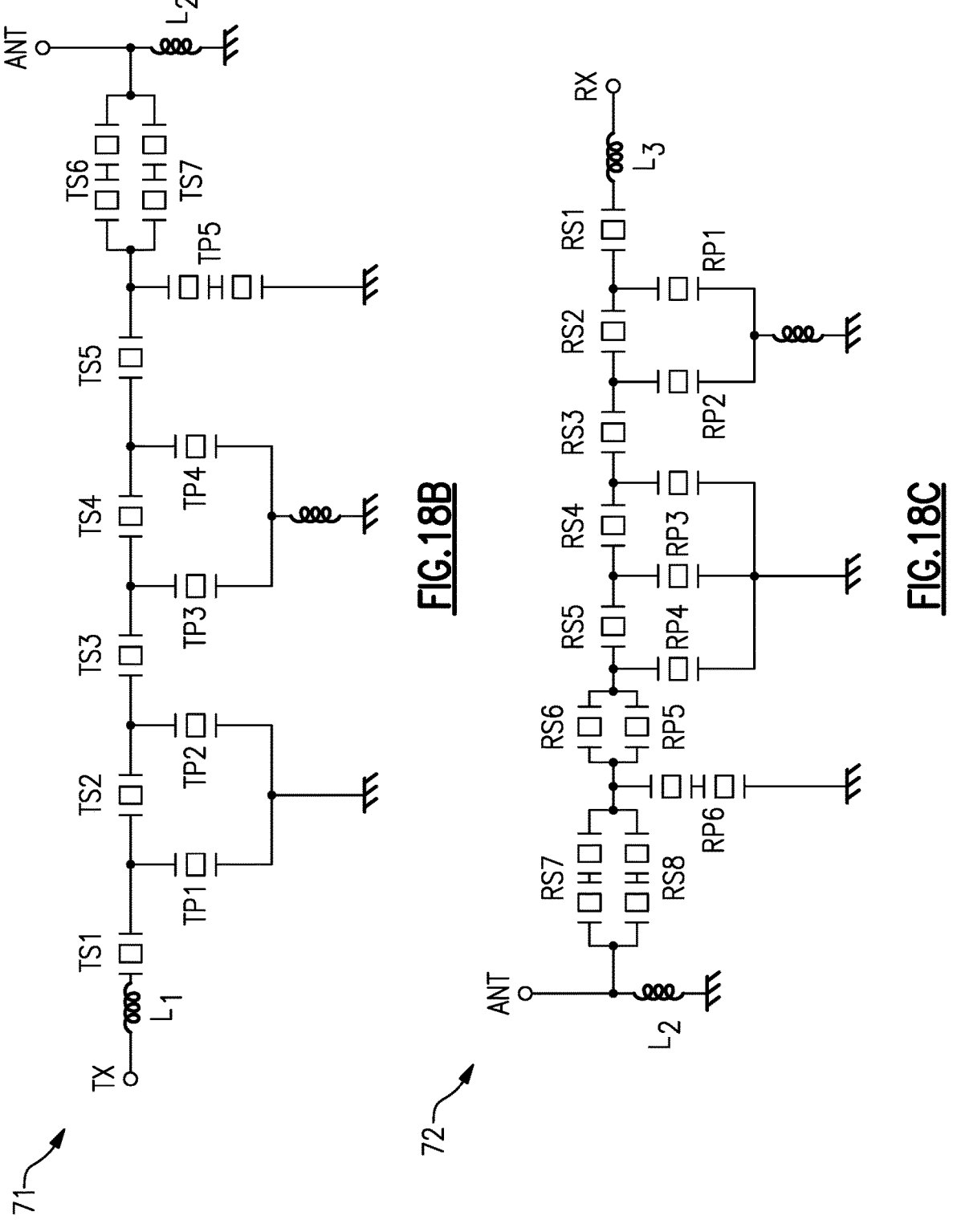
FIG. 18B is a schematic diagram of a transmit filter that includes a surface acoustic wave resonator according to an embodiment.
FIG. 18C is a schematic diagram of a receive filter that includes a surface acoustic wave resonator according to an embodiment.

FIG. 18B is a schematic diagram of an example transmit filter 71 that includes surface acoustic wave resonators of a surface acoustic wave component according to an embodiment. The transmit filter 71 can be a band pass filter. The illustrated transmit filter 71 is arranged to filter a radio frequency signal received at a transmit port TX and provide a filtered output signal to an antenna port ANT. The transmit filter 71 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1, TS2, TS3, TS4, TS5, TS6, and TS7 and/or TP1, TP2, TP3, TP4, and TP5 can be a SAW resonators with a conductive strip for transverse mode suppression in accordance with any suitable principles and advantages disclosed herein. For instance, one or more of the SAW resonators of the transmit filter 71 can be any surface acoustic wave resonator disclosed herein. Any suitable number of series SAW resonators and shunt SAW resonators can be included in a transmit filter 71.

FIG. 18C is a schematic diagram of a receive filter 72 that includes surface acoustic wave resonators of a surface acoustic wave component according to an embodiment. The receive filter 72 can be a band pass filter. The illustrated receive filter 72 is arranged to filter a radio frequency signal received at an antenna port ANT and provide a filtered output signal to a receive port RX. The receive filter 72 includes series SAW resonators RS1, RS2, RS3, RS4, RS5, RS6, RS7, and RS7, shunt SAW resonators RP1, RP2, RP3, RP4, RP5, and RP6, shunt inductor L2, and series output inductor L3. Some or all of the SAW resonators RS1, RS2, RS3, RS4, RS5, RS6, RS7, and RS8 and/or RP1, RP2, RP3, RP4, RP5, and RP6 can be SAW resonators in accordance with any suitable principles and advantages disclosed herein. For instance, one or more of the SAW resonators of the receive filter 72 can be any surface acoustic wave resonator disclosed herein. Any suitable number of series SAW resonators and shunt SAW resonators can be included in a receive filter 72.

Figure 19:
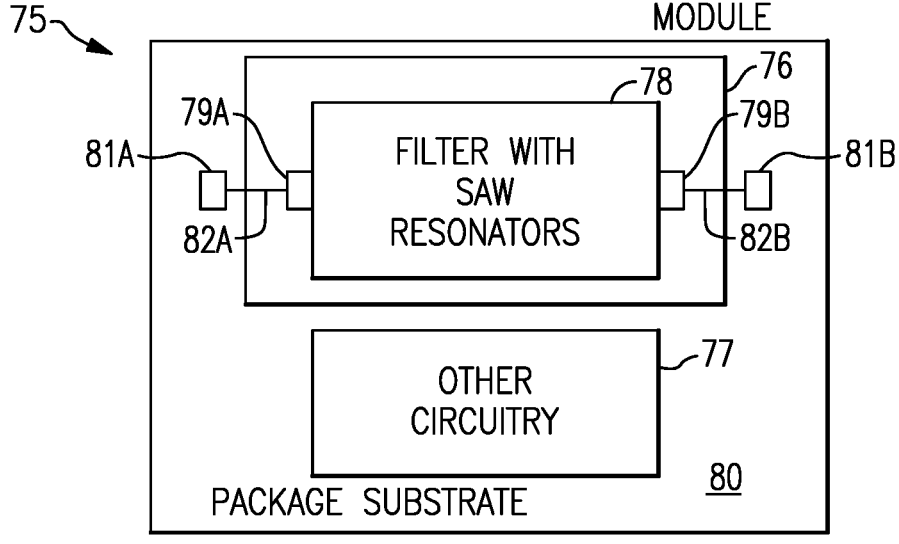
FIG. 19 is a schematic diagram of a radio frequency module that includes a surface acoustic wave component according to an embodiment.

FIG. 19 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW resonators with any suitable combination of features of the SAW resonators and/or acoustic wave devices disclosed herein. The SAW component 76 can include a SAW die that includes SAW resonators.

The SAW component 76 shown in FIG. 19 includes a filter 78 and terminals 79A and 79B. The filter 78 includes SAW resonators. One or more of the SAW resonators can be implemented in accordance with any suitable principles and advantages of the surface acoustic wave resonator 1 of FIGS. 1A and 1B and/or any surface acoustic wave resonator disclosed herein. The filter 78 can be a TC-SAW filter arranged as a band pass filter to filter radio frequency signals with frequencies below about 3.5 GHz in certain applications. The terminals 79A and 78B can serve, for example, as an input contact and an output contact. The SAW component 76 and the other circuitry 77 are on a common packaging substrate 80 in FIG. 19. The packaging substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 80. The overmold structure can encapsulate some or all of the components of the radio frequency module 75.

Figure 20:
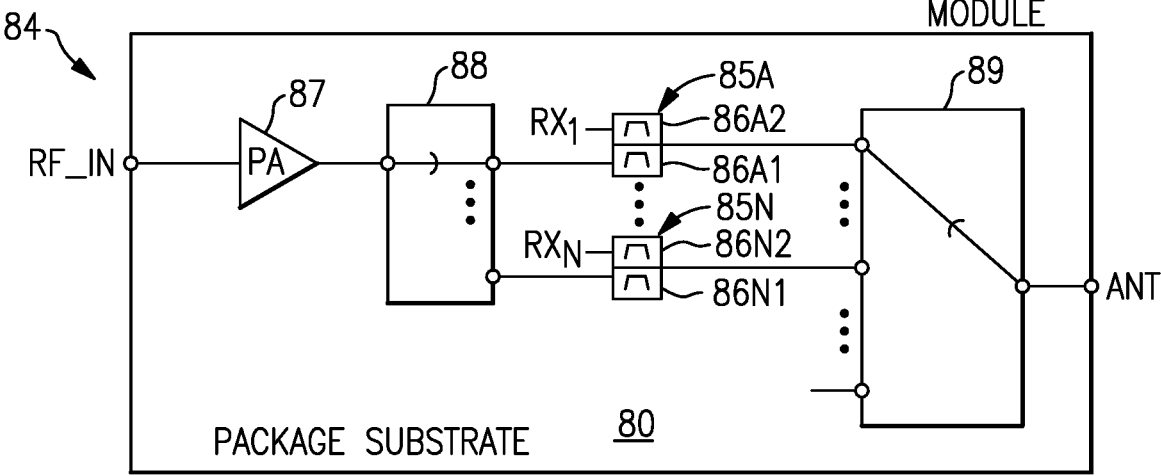
FIG. 20 is a schematic diagram of a radio frequency module that includes filters with surface acoustic wave resonators according to an embodiment.

FIG. 20 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 20 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 21A:
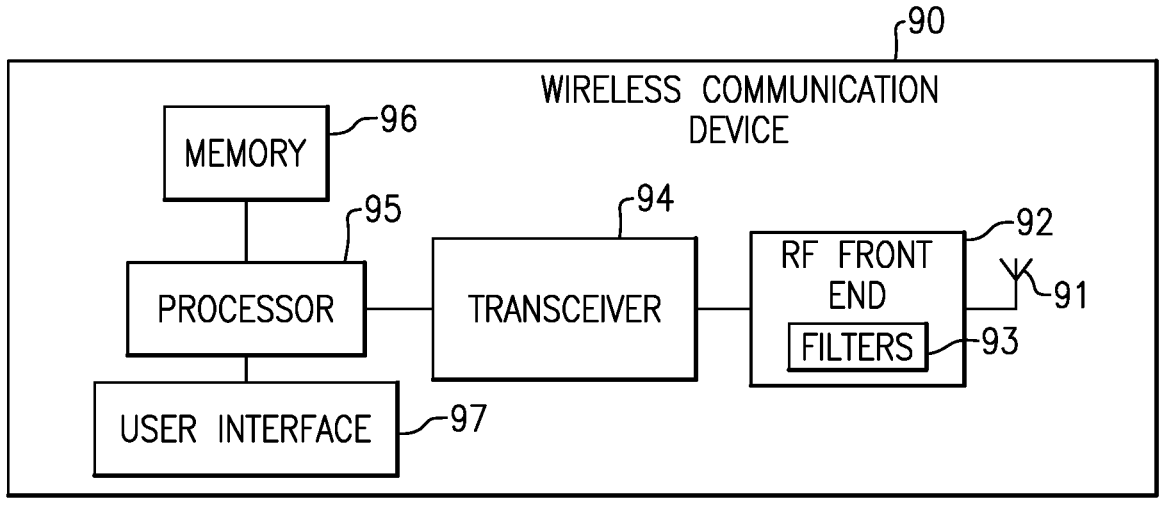
FIG. 21A is a schematic block diagram of a wireless communication device that includes a filter in accordance with one or more embodiments.

FIG. 21A is a schematic diagram of a wireless communication device 90 that includes filters 93 in a radio frequency front end 92 according to an embodiment. The filters 93 can include one or more SAW resonators in accordance with any suitable principles and advantages discussed herein. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals. Although not illustrated, the wireless communication device 90 can include a microphone and a speaker in certain applications.

The RF front end 92 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 92 can transmit and receive RF signals associated with any suitable communication standards. The filters 93 can include SAW resonators of a SAW component that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 21B:
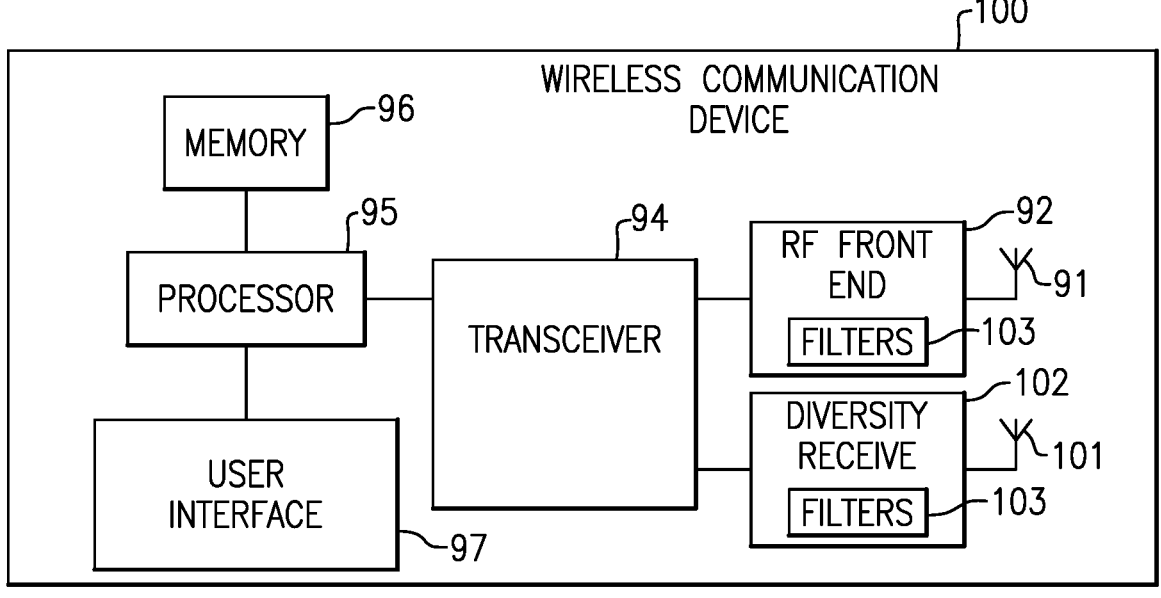
FIG. 21B is a schematic block diagram of another wireless communication device that includes a filter in accordance with one or more embodiments.

FIG. 21B is a schematic diagram of a wireless communication device 100 that includes filters 93 in a radio frequency front end 92 and a second filter 103 in a diversity receive module 102. The wireless communication device 100 is like the wireless communication device 90 of FIG. 21A, except that the wireless communication device 100 also includes diversity receive features. As illustrated in FIG. 21B, the wireless communication device 100 includes a diversity antenna 101, a diversity module 102 configured to process signals received by the diversity antenna 101 and including filters 103, and a transceiver 104 in communication with both the radio frequency front end 92 and the diversity receive module 102. The filters 103 can include one or more SAW resonators that include any suitable combination of features discussed with reference to any embodiments discussed above.

Figure 22:
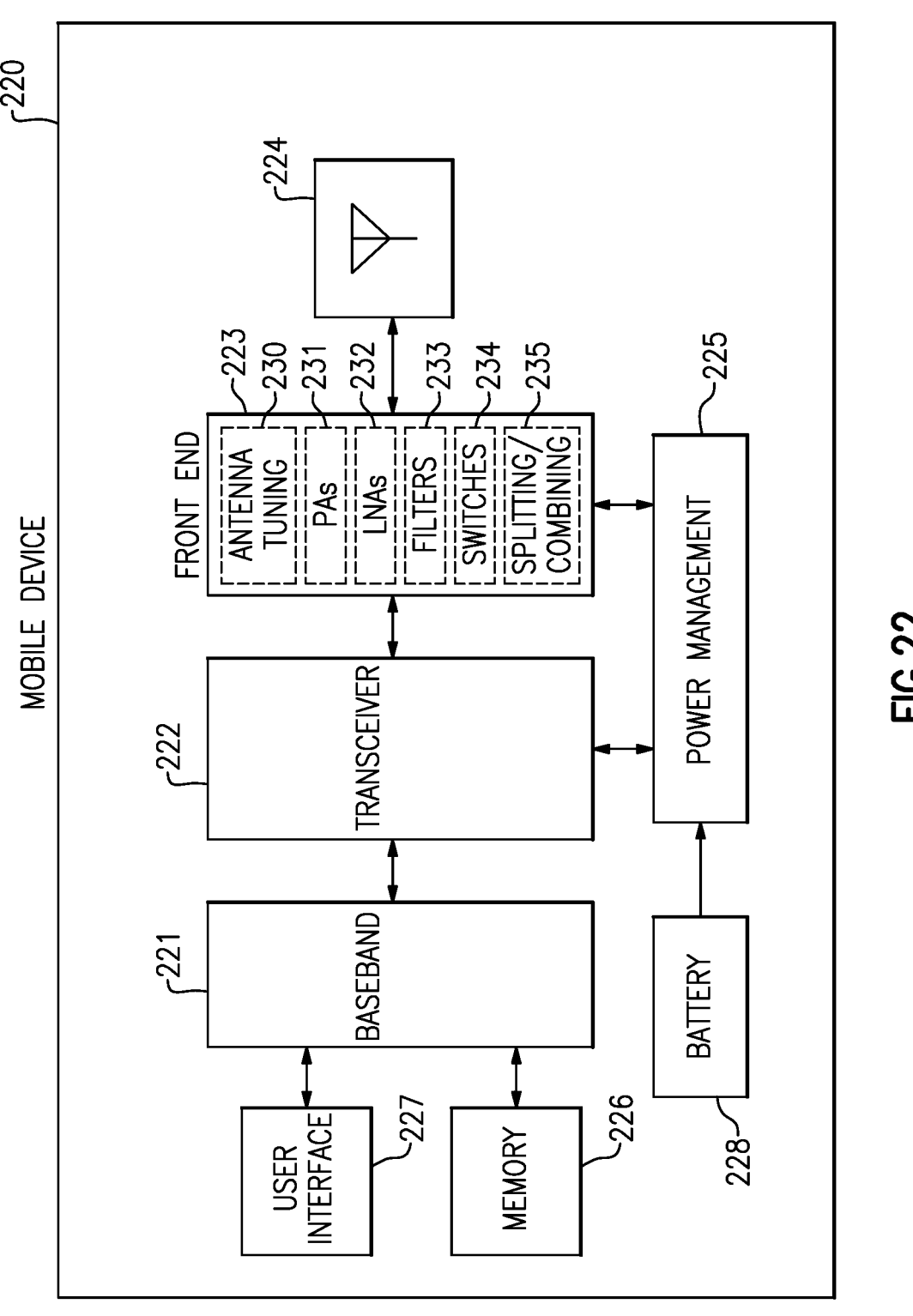
FIG. 22 is a schematic block diagram of a wireless communication device that includes a filter according to an embodiment.

FIG. 22 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 22 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAS) 231, low noise amplifiers (LNAs) 232, filters 233, switches 234, and signal splitting/combining circuitry 235. However, other implementations are possible. The filters 233 can include one or more acoustic wave filters that include any suitable number of bulk acoustic wave devices in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 22, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 22, the power management system 225 receives a battery voltage from the battery 228. The battery 228 can be any suitable battery for use in the wireless communication device 220, including, for example, a lithium-ion battery.

Any suitable principles and advantages of the surface acoustic wave devices disclosed herein can be implemented with one or more temperature compensated SAW resonators. Temperature compensated SAW resonators include a temperature compensation layer (e.g., a silicon dioxide layer) over an interdigital transducer electrode to bring a temperature coefficient of frequency closer to zero.

Packaged surface acoustic wave devices disclosed herein can include one or more surface acoustic wave resonators included in a filter arranged to filter a radio frequency signal in a fourth generation (4G) Long Term Evolution (LTE) operating band. Packaged surface acoustic wave devices disclosed herein can include one or more surface acoustic wave resonators included in a filter arranged to filter a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. Packaged surface acoustic wave devices disclosed herein can include one or more surface acoustic wave resonators included in a filter with a passband corresponding to both a 4G LTE operating band and a 5G NR operating band within FR1.

Any of the embodiments disclosed herein can combined. Any of the embodiments described above can be implemented in association with a radio frequency system and/or mobile devices such as cellular handsets. The principles and advantages of the embodiments can be used for any systems or apparatus that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz, a frequency range from about 450 MHz to 2.5 GHZ, or a frequency range from about 450 MHz to 3 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, a peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a piezoelectric layer;
an interdigital transducer electrode over the piezoelectric layer, the interdigital transducer electrode including an active region that has a center region and an edge region, a bus bar, and a gap region between the active region and the bus bar, at least a portion of the center region is in direct physical contact with the piezoelectric layer;
a temperature compensation layer over the interdigital transducer electrode; and
a dielectric layer positioned partially between the piezoelectric layer and the interdigital transducer electrode, the acoustic wave device configured to generate an acoustic wave with a wavelength of L, and the dielectric layer has a thickness in a range from 0.005L to 0.02L.

2. The acoustic wave device of claim 1 wherein the dielectric layer is positioned so as to suppress transverse leakage of acoustic energy generated by the acoustic wave device.

3. The acoustic wave device of claim 1 wherein the dielectric layer is positioned under the edge region and the gap region.

4. The acoustic wave device of claim 1 wherein the dielectric layer is positioned under a location at or near an interface between the edge region and the gap region.

5. The acoustic wave device of claim 1 further comprising a mini bus bar in the gap region.

6. The acoustic wave device of claim 1 wherein a material of the temperature compensation layer and a material of the dielectric layer are the same.

7. The acoustic wave device of claim 1 wherein the dielectric layer includes silicon dioxide.

8. The acoustic wave device of claim 1 wherein the piezoelectric layer is a lithium niobate layer having a cut angle in a range from −20° YX to 25° YX.

9. The acoustic wave device of claim 1 wherein a shear horizontal mode is a main mode of the acoustic wave device.

10. The acoustic wave device of claim 1 wherein a Rayleigh mode is a main mode of the acoustic wave device.

11. The acoustic wave device of claim 1 wherein the dielectric layer is positioned in a recessed portion of the piezoelectric layer.

12. The acoustic wave device of claim 1 further comprising a piston mode structure configured to suppress a transverse mode of the acoustic wave generated by the acoustic wave device.

13. A surface acoustic wave device comprising:

a lithium niobate layer having a cut angle in a range of −20° YX to 25° YX;

an interdigital transducer electrode over the lithium niobate layer, the interdigital transducer electrode including an active region that has a center region and an edge region, a bus bar, and a gap region between the active region and the bus bar, at least a portion of the center region is in direct physical contact with the lithium niobate layer;

a temperature compensation layer over the interdigital transducer electrode; and a dielectric layer selectively positioned under a location at or near an interface between the edge region and the gap region, the surface acoustic wave device configured to generate a surface acoustic wave with a wavelength L, and the dielectric layer has a thickness in a range from 0.005L to 0.02L.

14. The surface acoustic wave device of claim 13 wherein the surface acoustic wave has a wavelength of L, and the dielectric layer selectively positioned under an area that is within 0.5L to 1.2L into the edge region from the gap region and an area that is within 0.5L to 1.2L into the gap region from the edge region.

15. The surface acoustic wave device of claim 13 wherein the dielectric layer is positioned in a recessed portion of the lithium niobate layer.

16. The surface acoustic wave device of claim 13 further comprising a piston mode structure configured to suppress a transverse mode of the surface acoustic wave generated by the surface acoustic wave device.

17. A packaged module including a substrate supporting at least one filter, the at least one filter including at least one surface acoustic wave device of claim 13.

18. The packaged module of claim 17 wherein the packaged module is a radio frequency front end module.

19. The packaged module of claim 17 wherein the packaged module is a diversity receive module.

20. A wireless communication device including an antenna, a transceiver, and one or more of the packaged modules of claim 17.

* * * * *